(12) United States Patent
Cho

(10) Patent No.: US 10,361,208 B2
(45) Date of Patent: Jul. 23, 2019

(54) SEMICONDUCTOR DEVICE, METHOD OF FABRICATING THE SAME, AND APPARATUS USED IN FABRICATION THEREOF

(71) Applicant: Choong-rae Cho, Hwaseong-si (KR)

(72) Inventor: Choong-rae Cho, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 15 days.

(21) Appl. No.: 15/635,725

(22) Filed: Jun. 28, 2017

(65) Prior Publication Data

US 2017/0301676 A1    Oct. 19, 2017

Related U.S. Application Data

(62) Division of application No. 14/845,951, filed on Sep. 4, 2015, now Pat. No. 9,735,016.

(30) Foreign Application Priority Data

Nov. 17, 2014    (KR) .................. 10-2014-0160058

(51) Int. Cl.
    *H01L 27/108*    (2006.01)
    *H01L 21/285*    (2006.01)
    (Continued)

(52) U.S. Cl.
    CPC .... *H01L 27/10879* (2013.01); *G11C 11/4074* (2013.01); *H01L 21/2253* (2013.01); *H01L 21/28518* (2013.01); *H01L 21/28537* (2013.01); *H01L 21/324* (2013.01); *H01L 21/326* (2013.01); *H01L 21/823892* (2013.01);
    (Continued)

(58) Field of Classification Search
    None
    See application file for complete search history.

(56) References Cited

U.S. PATENT DOCUMENTS 4,914,500 A    4/1990   Liu et al.
5,770,494 A    6/1998   Yamamoto et al.
(Continued)

FOREIGN PATENT DOCUMENTS

JP    1993-226251       9/1993
JP    1996-264660 A    10/1996
(Continued)

OTHER PUBLICATIONS

Takashi Matsukawa et al., "Variability Origins of Parasitic Resistance in FinFETs With Silicided Source/Drain", Apr. 4, 2012, IEEE Electron Device Letters, vol. 33, No. 4, pp. 474-476.
(Continued)

*Primary Examiner* — Andres Munoz
(74) *Attorney, Agent, or Firm* — Harness, Dickey & Pierce, P.L.C.

(57) ABSTRACT

A semiconductor device includes a substrate, upper impurity regions in upper portions of the substrate, metal electrodes electrically connected to the upper impurity regions, metal silicide layers between the metal electrodes and the upper impurity regions, and a lower impurity region in a lower portion of the substrate. A method of fabricating the semiconductor device and an apparatus used in fabricating the semiconductor device is also provided.

8 Claims, 30 Drawing Sheets

(51) Int. Cl.

| | | |
|---|---|---|
| *H01L 21/324* | (2006.01) | |
| *H01L 21/225* | (2006.01) | |
| *H01L 21/326* | (2006.01) | |
| *H01L 29/47* | (2006.01) | |
| *H01L 29/78* | (2006.01) | |
| *H01L 29/10* | (2006.01) | |
| *H01L 21/8238* | (2006.01) | |
| *G11C 11/4074* | (2006.01) | |

(52) U.S. Cl.
CPC .... *H01L 27/1085* (2013.01); *H01L 27/10814* (2013.01); *H01L 27/10817* (2013.01); *H01L 27/10823* (2013.01); *H01L 27/10826* (2013.01); *H01L 27/10855* (2013.01); *H01L 27/10876* (2013.01); *H01L 29/1087* (2013.01); *H01L 29/47* (2013.01); *H01L 29/78* (2013.01); *H01L 29/1083* (2013.01)

(56) References Cited

U.S. PATENT DOCUMENTS

| | | | |
|---|---|---|---|
| 5,874,342 A | | 2/1999 | Tsai et al. |
| 6,066,528 A | * | 5/2000 | Fazan ............... H01L 21/76849 |
| | | | 257/E21.009 |
| 6,238,986 B1 | | 5/2001 | Kepler et al. |
| 6,787,864 B2 | | 9/2004 | Paton et al. |
| 6,902,966 B2 | | 6/2005 | Yu et al. |
| 7,247,541 B2 | | 7/2007 | Lee et al. |
| 7,482,222 B2 | | 1/2009 | Lee et al. |
| 7,557,410 B2 | | 7/2009 | Lee et al. |
| 7,914,692 B2 | | 3/2011 | Saito et al. |
| 8,039,902 B2 | | 10/2011 | Kim et al. |
| 8,173,463 B2 | | 5/2012 | Son |
| 8,236,706 B2 | | 8/2012 | Peuse et al. |
| 8,324,043 B2 | | 12/2012 | Kim et al. |
| 2007/0082448 A1 | * | 4/2007 | Kim ................ H01L 27/10876 |
| | | | 438/268 |
| 2007/0264769 A1 | | 11/2007 | Lee et al. |
| 2007/0281461 A1 | * | 12/2007 | Jang ................ H01L 21/76804 |
| | | | 438/622 |
| 2011/0163394 A1 | * | 7/2011 | Park ................ H01L 21/28052 |
| | | | 257/413 |
| 2011/0298056 A1 | | 12/2011 | Ning et al. |
| 2014/0162442 A1 | | 6/2014 | Khaja et al. |
| 2016/0260627 A1 | * | 9/2016 | Nakano ............ H01L 21/67389 |

FOREIGN PATENT DOCUMENTS

| | | |
|---|---|---|
| JP | 3859546 B2 | 9/2006 |
| JP | 4368792 B2 | 11/2009 |
| KR | 10-0315451 A | 11/2000 |
| KR | 10-0366347 A | 6/2002 |
| KR | 10-0465056 B1 | 1/2005 |
| KR | 10-0538101 B1 | 12/2005 |
| KR | 10-2010-0056813 A | 5/2010 |
| KR | 10-1063567 B1 | 9/2011 |

OTHER PUBLICATIONS

Yoshifumi Nishi et al., "Schottky barrier height modulation by atomic dipoles at the silicide/silicon interface", American Physical Society, 2011, Physical Review, B 84, 115323, pp. 1-6.

Qingfeng Want., "Ultra-Shallow Junction Formation Using Silicide as a Diffusion Source and Low Thermal Budget", Nov. 1992, IEEE Transactions on Electron Devices, vol. 39, No. 11, pp. 2486-2496.

* cited by examiner

SEMICONDUCTOR DEVICE, METHOD OF FABRICATING THE SAME, AND APPARATUS USED IN FABRICATION THEREOF

CROSS-REFERENCE TO RELATED APPLICATION

This application is a divisional of U.S. application Ser. No. 14/845,951, filed on Sep. 4, 2015, which claims priority under 35 U.S.C. § 119 to Korean Patent Application No. 10-2014-0160058, filed on Nov. 17, 2014, in the Korean Intellectual Property Office, the entire contents of each of the above-referenced applications are hereby incorporated by reference.

BACKGROUND

Inventive concepts relate to a method of fabricating a semiconductor device, and more particularly, to a semiconductor device, a method of fabricating the same, and an apparatus used in fabrication thereof.

In fabrication of semiconductor devices, contact technologies for obtaining low contact resistance values may be required to produce high performance semiconductor devices. A metal silicidation process has been widely used in formation of contact structures having a low contact resistance value. For example, a metal layer such as a cobalt (Co) layer or a nickel (Ni) layer may be deposited on a silicon substrate or a polysilicon layer and the metal layer may be annealed to form a cobalt silicide ($CoSi_x$) layer or a nickel silicide ($NiSi_x$) layer. In addition, after impurity ions are implanted into active regions of a silicon substrate to form source/drain regions, the impurity ions in the source/drain regions may be activated to reduce contact resistance values of the source/drain regions.

SUMMARY

Inventive concepts relate to semiconductor devices, methods of fabricating the same, and/or apparatuses used in fabrication thereof.

According to example embodiments of inventive concepts, a semiconductor device includes a substrate, upper impurity regions in upper portions of the substrate, metal electrodes electrically connected to the upper impurity regions, metal silicide layers between the metal electrodes and the upper impurity regions, and a lower impurity region in a lower portion of the substrate.

In example embodiments, the substrate may be a P-type substrate, the upper impurity regions may include NMOS impurity regions of an NMOS transistor, and the NMOS impurity regions may include a P-type heavily doped region in the substrate and an N-type halo region under the P-type heavily doped region.

In example embodiments, the substrate may be a P-type substrate, the substrate may include an N-type well, the upper impurity regions may include P-type heavily doped source and drain regions of a PMOS transistor and N-type heavily doped source and drain regions of an NMOS transistor. The PMOS transistor may include an N-type heavily doped body contact region in the N-type well. The NMOS transistor may include a P-type heavily doped body contact region in the substrate and an N-type halo region under the P-type heavily doped region in the substrate. The lower impurity region may be a P-type heavily doped lower impurity region.

In example embodiments, the semiconductor device may further include global buried contacts (GBCs) respectively on the upper impurity regions. The semiconductor device may be a dynamic random access memory (DRAM) device. The metal silicide layers may be between the GBCs and the metal electrodes.

In example embodiments, the semiconductor device may be a logic device, the upper impurity regions may include source/drain regions and body contact regions. The metal silicide layers may correspond to interfacial layers between the source/drain regions and the metal layers as well as between the body contact regions and the metal layers.

According to example embodiments of inventive concepts, a method of fabricating a semiconductor device includes forming a metal layer on an active layer, applying a first annealing process to the metal layer and the active layer to form a metal silicide layer, and concentrating impurity ions in the active layer at an interface between the active layer and the metal silicide layer by creating an electric field across the active layer and the metal silicide layer.

In example embodiments, the first annealing process and the concentrating impurity ions may be performed at the same time such that the electric field is created while the first annealing process is applied.

In example embodiments, the concentrating impurity ions may include applying a second annealing process to the active layer and the metal silicide layer after the first annealing process. The electric field may be created during the second annealing process.

In example embodiments, the active layer and the metal layer may contact other to define a Schottky junction therebetween. The concentrating impurity ions may include applying a voltage that is equal to or lower than 10 volts to the Schottky junction in order to create the electric field.

In example embodiments, the first annealing process may include the concentrating impurity ions by creating the electric field across the active layer and the metal silicide layer or the concentrating impurity ions may include a second annealing process that is formed after the first anneal process and includes the creating the electric field across the active layer and the metal silicide layer. The first and second annealing processes may be performed at a temperature about 150 degrees Celsius to about 1100 degrees Celsius.

In example embodiments, the method may further include implanting impurity ions into the active layer. The implant impurity ions into the active layer may be performed before the forming the metal layer, while the applying the first annealing process is performed, or after the applying the first annealing process is performed.

In example embodiments, the implanting the impurity ions into the active layer may include using an in-situ doping process while the active layer is formed if the impurity ions are implanted before the metal layer is formed.

In example embodiments, the concentrating impurity ions in the active layer may include concentrating the impurity ions at an interface between the active layer and the metal silicide layer using an ion implantation process and a second annealing process that are performed after the applying the first annealing process.

In example embodiments, the method may further including forming a polysilicon layer on the active layer before the forming the metal layer, and implanting impurity ions into the polysilicon layer after the applying the first annealing process. The semiconductor device may be a DRAM device. The forming the metal layer may include forming the metal layer on the polysilicon layer. The concentrating the impurity ions may include creating the electric field during the implanting the impurity ions into the polysilicon layer or during a second annealing process that is performed after the implanting the impurity ions into the polysilicon layer.

In example embodiments, the polysilicon layer may constitute a global buried contact (GBC) of the DRAM device, and the metal silicide layer may correspond to an interfacial layer between the GBC and the metal layer.

In example embodiments, the method may further include implanting impurity ions into the active layer before the forming the metal layer. The semiconductor device may be a logic device including a CMOS circuit. The concentrating impurity ions may include creating the electric field during the applying the first annealing process or while a second annealing process is performed after the applying the first annealing process.

In example embodiments, the metal silicide layer may be an interfacial layer between the metal layer and the source/drain regions.

According to example embodiments of inventive concepts, a method of fabricating a semiconductor device includes forming an active layer on a substrate, forming a metal layer on the active layer, forming an upper electrode on a top surface of the substrate including the active layer and the metal layer, forming a lower electrode on a bottom surface of the substrate to provide ohmic contact between the lower electrode and the substrate, and annealing the substrate including the lower electrode and the lower electrode while an electric field is created between the upper electrode and the lower electrode.

In example embodiments, the method may further include forming a polysilicon layer on the active layer before the forming the metal layer, and applying a first annealing process to the polysilicon layer and the metal layer to form a metal silicide layer before the forming the upper electrode.

In example embodiments, the method may further include implanting impurity ions into the polysilicon layer before the forming the metal layer or after the applying the first annealing process. The impurity ions may be concentrated at an interface between the polysilicon layer and the metal silicide layer during the annealing the substrate while the electric field is created between the upper electrode and the lower electrode.

In example embodiments, the method may further include implanting impurity ions into the active layer before the forming the metal layer. The annealing the substrate while the electric field is created may include forming a metal silicide between the active layer and the metal layer, and concentrating the impurity ions in the active layer at an interface between the active layer and the metal silicide layer.

In example embodiments, the forming the active layer and the metal layer may include forming a body contact region in the substrate and forming a halo region under the body contact region. The forming the lower electrode may include forming a heavily doped region in a lower portion of the substrate.

In example embodiments, the substrate may be a P-type substrate. The active regions may include PMOS impurity regions of a PMOS transistor and NMOS impurity regions of an NMOS transistor. The PMOS impurity regions may include an N-type well in the substrate, an N-type heavily doped body contact region in the N-type well, and P-type heavily doped source and drain regions n the N-type well. The NMOS impurity regions may include a P-type heavily doped body contact region in the substrate, an N-type halo region under the P-type heavily doped region in the substrate, and N-type heavily doped source and drain regions in the substrate. The lower electrode may further include a P-type heavily doped lower impurity region in a lower portion of the substrate.

In example embodiments, the upper electrode may include a titanium (Ti) layer and a titanium nitride (TiN) layer or a Ti/TiN layer and a tungsten (W) layer. The lower electrode may include a Ti/TiN layer.

According to example embodiments of inventive concepts, an apparatus that may be used in fabricating a semiconductor device is provided. The apparatus includes a supporter configured to support a wafer, a temperature/voltage controller configured to control a temperature and a voltage applied to the wafer, a heat source over the supporter, the heat source being configured to emit heat toward the wafer and be controlled by the temperature/voltage controller, a power source configured to apply a voltage to the wafer and be controlled by the temperature/voltage controller, an upper lead probe connected to the power source and configured to contact a top surface of the wafer, and a lower lead probe connected to a ground terminal of the power source and configured to contact a bottom surface of the wafer.

In example embodiments, the wafer may include a lower electrode on a top surface thereof and an upper electrode connected to a bottom surface thereof, the upper lead probe may contact the lower electrode, and the lower lead probe may contact the upper electrode.

In example embodiments, the temperature/voltage controller may be configured to apply programmed heat and voltage to the wafer through the heat source and the power source in a concurrent time domain.

In example embodiments, a temperature sensor may be under the wafer. The temperature/voltage controller may be configured to control an operation of the heat source based on temperature information that is outputted from the temperature sensor.

In example embodiments, the apparatus may be configured to concentrate impurity ions in the wafer at an interface between the active layer and a metal silicide layer in the wafer, based on emitting heat from the heat source and applying the voltage generated from the power source to the wafer.

According to example embodiments of inventive concepts, a method of fabricating a semiconductor device includes forming a conductive layer on an active layer; and performing an annealing process while applying a voltage across the active layer and concentrating impurity ions at an interface between an impurity region of the active layer and the conductive layer.

In example embodiments, the forming the conductive layer on the active layer may include forming a metal layer on the active layer and transforming at least a part of the metal layer to a metal silicide layer on the active layer, and the performing the annealing process while applying the voltage across the active layer and concentrating the impurity ions may include concentrating the impurity ions at an interface between the impurity region of the active layer and the metal silicide layer.

In example embodiments, the forming the conductive layer on the active layer may include forming a metal layer on the active layer, and the performing the annealing process while applying the voltage across the active layer and concentrating the impurity ions may include transforming at least part of the metal layer to a metal silicide layer during the annealing process.

In example embodiments, the active layer and the conductive layer may contact each other to define a Schottky junction therebetween, and the performing the annealing process while applying the voltage across the active layer and concentrating the impurity ions may include creating an electric field across the Schottky junction based on applying the voltage to the Schottky junction in a range that is equal to or lower than 10.

In example embodiments, the annealing process is performed at a temperature of about 150 degrees Celsius to about 1100 degrees Celsius.

BRIEF DESCRIPTION OF THE DRAWINGS

The foregoing and other features of inventive concepts will be apparent from the more particular description of non-limiting embodiments of inventive concepts, as illustrated in the accompanying drawings in which like reference characters refer to like parts throughout the different views. The drawings are not necessarily to scale, emphasis instead being placed upon illustrating principles of inventive concepts. In the drawings.

DETAILED DESCRIPTION OF EXAMPLE EMBODIMENTS

Figure 1A:
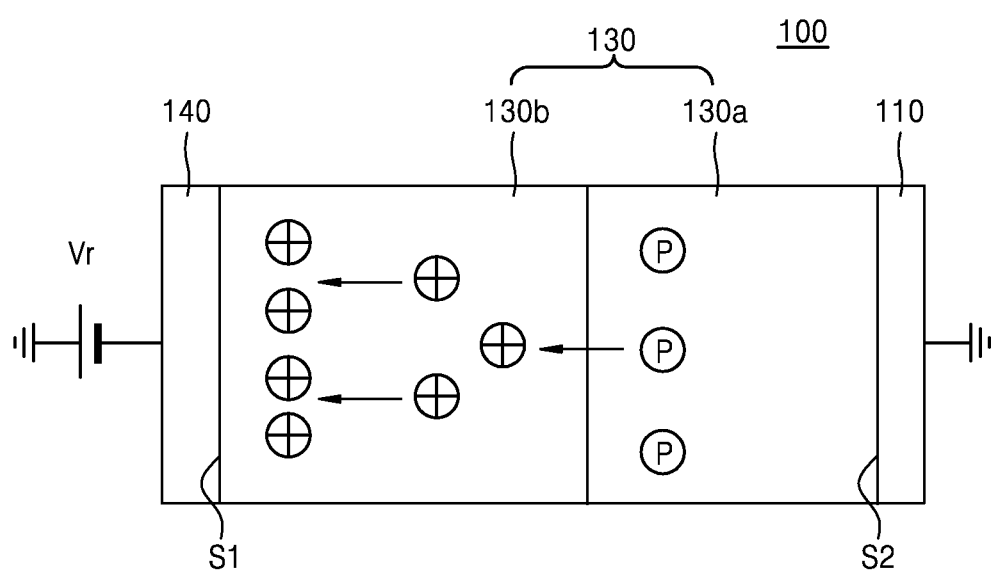
FIGS. 1A and 1B illustrate a cross-sectional view of a semiconductor device and a graph of a voltage versus a distance to explain a principle of an annealing process accompanied with electric field used in fabrication of a semiconductor device according to example embodiments.

Example embodiments will now be described more fully with reference to the accompanying drawings, in which some example embodiments are shown. Example embodiments, may, however, be embodied in many different forms and should not be construed as being limited to the embodiments set forth herein; rather, these example embodiments are provided so that this disclosure will be thorough and complete, and will fully convey the scope of example embodiments of inventive concepts to those of ordinary skill in the art. In the drawings, the thicknesses of layers and regions are exaggerated for clarity. Like reference characters and/or numerals in the drawings denote like elements, and thus their description may be omitted.

It will be understood that when an element or layer is referred to as being "connected to" or "coupled to" another element or layer, the element or layer may be directly connected or coupled to the other element or layer, or intervening elements or layers may be present. In contrast, when an element is referred to as being "directly connected" or "directly coupled" to another element, there are no intervening elements present. Other words used to describe the relationship between elements or layers should be interpreted in a like fashion (e.g., "between" versus "directly between," "adjacent" versus "directly adjacent," "on" versus "directly on"). As used herein the term "and/or" includes any and all combinations of one or more of the associated listed items.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof. Expressions such as "at least one of," when preceding a list of elements, modify the entire list of elements and do not modify the individual elements of the list.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 1B:
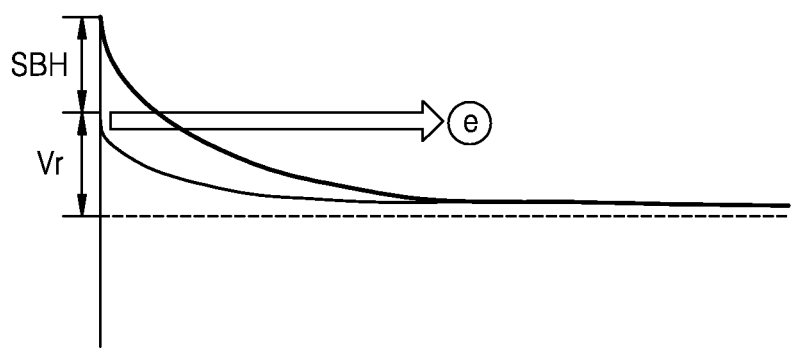

FIGS. 1A and 1B illustrate a cross-sectional view of a semiconductor device and a graph of a voltage versus a distance to explain a principle of an annealing process accompanied with electric field used in fabrication of a semiconductor device according to example embodiments.

Referring to FIG. 1A, an annealing process accompanied with electric field may be used in fabrication of a semiconductor device 100 including a contact structure comprised of a metal silicide layer 140 and a silicon layer 130. The semiconductor device 100 may include the silicon layer 130 heavily doped with N-type impurities, the metal silicide layer 140 disposed on a first surface S1 of the silicon layer 130, and an ohmic contact layer 110 disposed on a second surface S2 of the silicon layer 130 opposite to the metal silicide layer 140. The silicon layer 130 may include a depletion region 130b contacting the metal silicide layer 140 and a non-depletion region 130a contacting the ohmic contact layer 110. Accordingly, the first surface S1 of the silicon layer 130 may correspond to an interface between the metal silicide layer 140 and the depletion region 130b, and the second surface S2 of the silicon layer 130 may correspond to an interface between the ohmic contact layer 110 and the non-depletion region 130a.

Meanwhile, the ohmic contact layer 110 may be formed on the second surface S2 of the silicon layer 130 so that most of a reverse biased voltage Vr applied between the metal silicide layer 140 and the silicon layer 130 is applied across the depletion region 130b. If it is assumed that most of the reverse biased voltage Vr between the metal silicide layer 140 and the silicon layer 130 is applied across the depletion region 130b, a Schottky barrier height (SBH) of the metal silicide layer 140 and the silicon layer 130 may increase by the reverse biased voltage Vr and a width of the depletion region 130b may also increase, as illustrated in the graph of FIG. 1B.

As such, if the reverse biased voltage Vr is applied between the metal silicide layer 140 and the silicon layer 130 using the ohmic contact layer 110, electric field between the metal silicide layer 140 and the silicon layer 130 may increase to concentrate dopants at an interface between the metal silicide layer 140 and the silicon layer 130. For example, when a width of the depletion region 130b is 5 nanometers and the reverse biased voltage Vr applied between the metal silicide layer 140 and the silicon layer 130 is 0.5 volts, electric field of about $1 \times 10^6$/cm may be created across the depletion region 130b if it is assumed that most of the reverse biased voltage Vr is applied across the depletion region 130b. Thus, dopants corresponding to N-type impurity ions such as phosphorus (P) ions or arsenide (As) ions in the silicon layer 130 may be concentrated at an interface between the metal silicide layer 140 and the silicon layer 130. Meanwhile, since electrons having a relatively low mass pass through the depletion region 130b at a high speed, the interaction between the dopants and the electrons may be neglected and may not cause leakage current generated due to the electric field.

Ionized donor atoms (e.g., donor ions) having positive net charges in the depletion region 130b may be drifted by a negative bias corresponding to the reverse biased voltage Vr to move toward the interface between the metal silicide layer 140 and the silicon layer 130. Thus, a dopant concentration at the interface between the metal silicide layer 140 and the silicon layer 130 may increase. In addition, the ionized donor atoms may be more stably activated in the silicon layer 130 under the negative bias condition. Accordingly, a contact resistance value between the metal silicide layer 140 and the silicon layer 130 may be reduced. Meanwhile, if the ionized donor atoms in the depletion region 130b are accumulated at the interface between the metal silicide layer 140 and the silicon layer 130, donors in the non-depletion region 130a may be supplied into the depletion region 130b.

In order to reduce a contact resistance value between a metal layer and a silicon layer, dopants should be stably activated at an interface between the metal layer and the silicon layer and an abrupt junction should be formed at the interface between the metal layer and the silicon layer. The abrupt junction may be formed by confining a heavily doped impurity region in the vicinity of the interface between the metal layer and the silicon layer. The dopants may be more activated at a high temperature. However, if the temperature rises up, diffusion of the dopants may also increase. In such a case, it may be difficult to concentrate the dopants at the interface between the metal layer and the silicon layer. Accordingly, a metal silicide layer may be generally formed to reduce the contact resistance value of the silicon layer. Nevertheless, there may be a limitation in reducing the contact resistance value of the silicon layer because a junction location varies according to a growth of the metal silicide layer. In fabrication of a semiconductor device, the metal silicide layer may be formed to reduce an eternal resistance value except a channel resistance value of a metal-oxide-semiconductor (MOS) transistor. However, if the metal silicide layer is used in fabrication of a semiconductor device, deviation of a resistance value may increase due to external growth and inhomogeneous phases of the metal silicide layer.

Meanwhile, the dopants may be excessively implanted into a silicon layer to form source/drain regions and to reduce a contact resistance of the source/drain regions. That is, the dopants may be super-saturated to reduce a contact resistance of the source/drain regions. However, in such a case, diffusion by heat budget and de-activation of the dopants may be generated to degrade performance of a semiconductor device. For example, in fabrication of DRAM devices, if dopants in a silicon layer are super-saturated to form a global buried contact (GBC) structure comprised of a cobalt silicide ($CoSi_2$) layer and a polysilicon layer, the morphology of the polysilicon layer may be degraded and a gate induced drain leakage (GIDL) characteristic of cell transistors in the DRAM devices may also be degraded. As a result, a refresh interval time tREF of the DRAM devices may be reduced to degrade a refresh characteristic of the DRAM devices. Further, in fabrication of logic devices, if dopants in a silicon layer are super-saturated to form a contact structure comprised of a nickel silicide (NiSi) layer and the silicon layer, a spreading resistance value Rspr may increase and an off-current value of MOS transistors may also increase. As a result, the MOS transistors may suffer from a short channel effect.

According to example embodiments, an annealing process accompanied with electric field may be used in fabrication of a semiconductor device. The annealing process accompanied with electric field may concentrate dopants at an interface between a metal silicide layer and a silicon layer and may stably activate the concentrated dopants to reduce a contact resistance value between the metal silicide layer and the silicon layer. Accordingly, the annealing process accompanied with electric field may reduce problems that occur due to high temperature of the conventional annealing process and super-saturation of dopants. In addition, if the annealing process accompanied with electric field is used in fabrication of semiconductor devices, a thickness of the metal silicide layer may be reduced.

Figure 2:
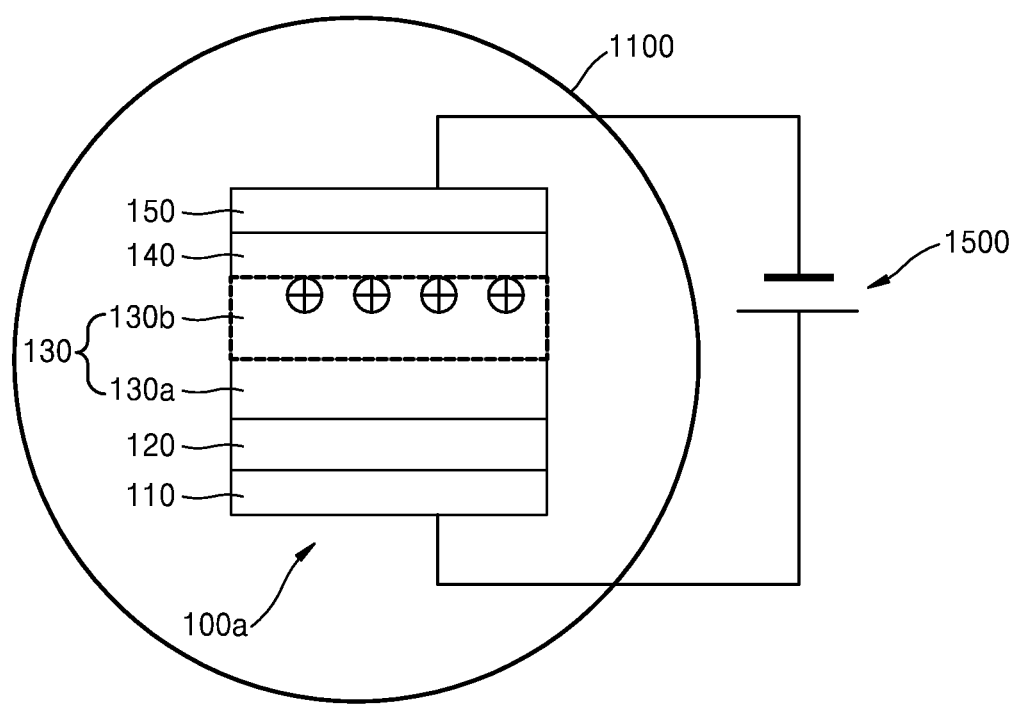
FIG. 2 is a schematic diagram illustrating an annealing process accompanied with electric field used in a fabrication method of a semiconductor device according to example embodiments.

FIG. 2 is a schematic diagram illustrating an annealing process accompanied with electric field used in a fabrication method of a semiconductor device according to example embodiments.

Referring to FIG. 2, an annealing process accompanied with electric field may be performed at a wafer level. That is, the annealing process accompanied with electric field may be applied to not respective semiconductor devices but an entire wafer including a plurality of semiconductor devices.

Specifically, in order to perform the annealing process accompanied with electric field, a wafer including a semiconductor device 100a may be loaded into an annealing chamber 1100 and a power source 1500 may be connected to the semiconductor device 100a to create electric field across the semiconductor device 100a. The semiconductor device 100a may include an ohmic contact layer 110, a substrate 120, an active layer 130, a metal silicide layer 140 and an upper electrode 150 which are sequentially stacked.

The ohmic contact layer 110 may be disposed on a bottom surface of the substrate 120 to include a lower electrode (112 of FIG. 12) and a heavily doped region (114 of FIG. 12) disposed between the substrate 120 and the lower electrode 112. In example embodiments, the ohmic contact layer 110 may be comprised of only the lower electrode 112 and the heavily doped region 114 may be included in the substrate 120 or may be independently disposed. The ohmic contact layer 110 may be formed so that most of a voltage provided by the power source 1500 is applied across a depletion region 130b of the active layer 130, as described with reference to FIG. 1. If the substrate 120 and the lower electrode 112 directly contact each other without the heavily doped region 114, a Schottky junction may be present between the substrate 120 and the lower electrode 112 and a portion of a voltage provided by the power source 1500 may be applied across the Schottky junction between the substrate 120 and the lower electrode 112. In such a case, dopants in the depletion region 130b may be insufficiently concentrated at the interface between the metal silicide layer 140 and the depletion region 130b.

The lower electrode 112 may be formed of a refractory metal layer having excellent process compatibility. In addition, the lower electrode 112 may be formed to have a single-layered structure or a multi-layered structure. For example, the lower electrode 112 may be formed of a combination layer of a titanium (Ti) layer and a titanium nitride (TiN) layer. However, the lower electrode 112 is not limited to a combination layer of a titanium (Ti) layer and a titanium nitride (TiN) layer. The heavily doped region 114 may be a P-type region if the substrate 120 is a P-type substrate. In example embodiments, the heavily doped region 114 may be formed by implanting boron atoms into the substrate 120 of a P-type conductivity and may be formed to have an impurity concentration of at least $1 \times 10^{19}/cm^3$. For example, the heavily doped region 114 may be formed to have an impurity concentration of at least the impurity region may be formed to have an impurity concentration in a range of at least $1 \times 10^{19}/cm^3$ to at least $1 \times 10^{20}/cm^3$. The dopant of the heavily doped region 114 is not limited to boron atoms. The heavily doped region 114 may be an N-type region if the substrate 120 is an N-type substrate.

The substrate 120 may be a semiconductor layer. For example, the substrate 120 may be a single crystalline silicon layer, a polycrystalline silicon layer (also, referred to as a polysilicon layer), or an amorphous silicon layer. However, the substrate 120 is not limited to a silicon substrate. For example, in example embodiments, the substrate 120 may include a Group IV material such as germanium (Ge), a Group IV-IV compound material such as silicon germanium (SiGe) or silicon carbide (SiC), or a Group III-V compound material such as gallium arsenide (GaAs), indium arsenide (InAs) or indium phosphide (InP). The substrate 120 may be a bulk substrate, for example, a silicon (Si) bulk substrate or a silicon germanium (SiGe) bulk substrate. Alternatively, the substrate 120 is not limited to a bulk substrate. For example, the substrate 120 may be an epitaxial wafer, a polished wafer, or an annealed wafer.

The substrate 120 may be a P-type substrate doped with P-type impurities or an N-type substrate doped with N-type impurities. For example, in a non-limiting example, the substrate 120 may be a P-type substrate.

The active layer 130 may be an impurity region that is formed by implanting P-type impurities or N-type impurities into the substrate 120. In a non-limiting example, the active layer 130 may be an N-type impurity region that is formed by implanting N-type impurities into the substrate 120 having a P-type conductivity. This N-type impurity region 130 may act as an N-type source/drain region (134sd of FIG. 12) included in a complementary MOS (CMOS) device. As illustrated in FIG. 2, the depletion region 130b may be formed in the active layer 130 to contact the metal silicide layer 140.

The metal silicide layer 140 may be disposed on the active layer 130 to provide a Schottky junction between the metal silicide layer 140 and the active layer 130. The metal silicide layer 140 may be, for example, a nickel silicide ($NiSi_x$) layer. The metal silicide layer 140 may be formed by depositing a metal layer such as nickel layer (or a cobalt layer) on the active layer 130 and by annealing the metal layer to react the metal layer with the active layer 130.

The upper electrode 150 may be formed of a refractory metal layer having an excellent process compatibility, like the lower electrode 112. In addition, the upper electrode 150 may be formed to have a single-layered structure or a multi-layered structure. For example, the upper electrode 150 may be formed of a combination layer of a titanium (Ti)

layer and a titanium nitride (TiN) layer. The upper electrode 150 may further include a tungsten layer disposed on the Ti/TiN layer. The upper electrode 150 may be divided into a plurality of metal patterns after electric field is applied to the wafer including the semiconductor devices 100a, and each of the plurality of metal patterns may be used as a metal electrode through which an electric signal or a voltage is applied to one among the plurality of semiconductor devices.

The wafer including the semiconductor device 100a having the aforementioned structure may be loaded into the annealing chamber 1100, and the ohmic contact layer 110 and the upper electrode 150 may be electrically connected to both output terminals of the power source 1500 to perform the annealing process accompanied with electric field. The power source 1500 may be electrically connected to the ohmic contact layer 110 and the upper electrode 150 so that a negative bias is applied to the Schottky junction between the metal silicide layer 140 and the active layer 130. For example, if the active layer 130 is an N-type impurity region, the upper electrode 150 may be electrically connected to a negative electrode of the power source 1500 and the ohmic contact layer 110 may be electrically connected to a positive electrode of the power source 1500.

As a result of the annealing process accompanied with electric field, dopants in the active layer 130 may be concentrated at an interface between the metal silicide layer 140 and the active layer 130. For example, if the active layer 130 is an N-type impurity region, donor ions (e.g., phosphorus ions or arsenide ions) having positive net charges may be concentrated at the interface between the metal silicide layer 140 and the active layer 130. Thus, a dopant concentration at the interface between the metal silicide layer 140 and the active layer 130 may increase, and the dopants may be stably activated. Accordingly, a contact resistance value between the metal silicide layer 140 and the active layer 130 may be reduced.

Figure 3:
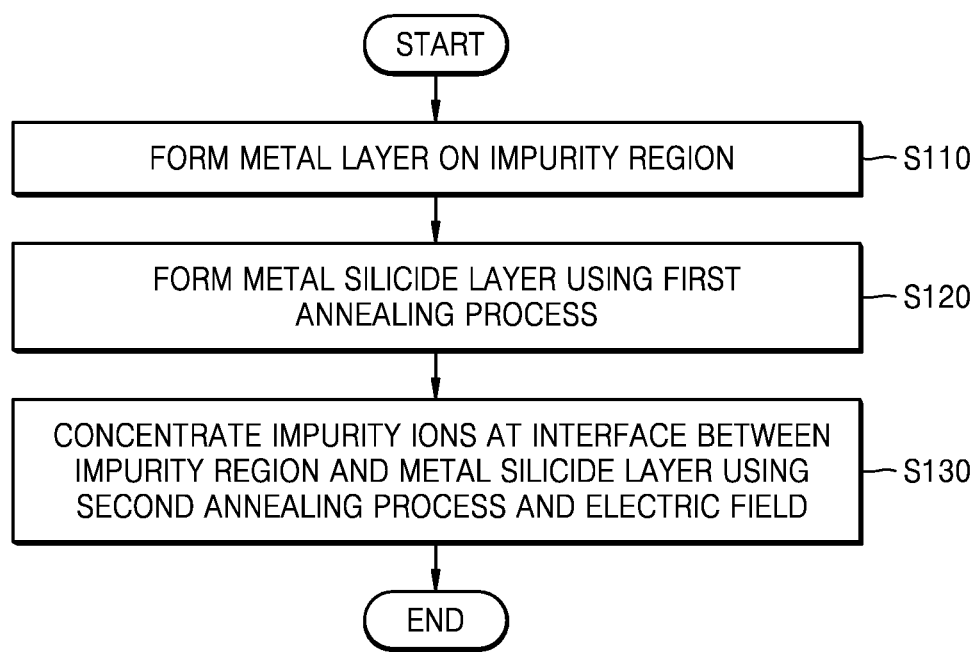
FIGS. 3, 4 and 5 are process flowcharts illustrating methods of fabricating semiconductor devices according to example embodiments using an annealing process accompanied with electric field.
Figure 4:
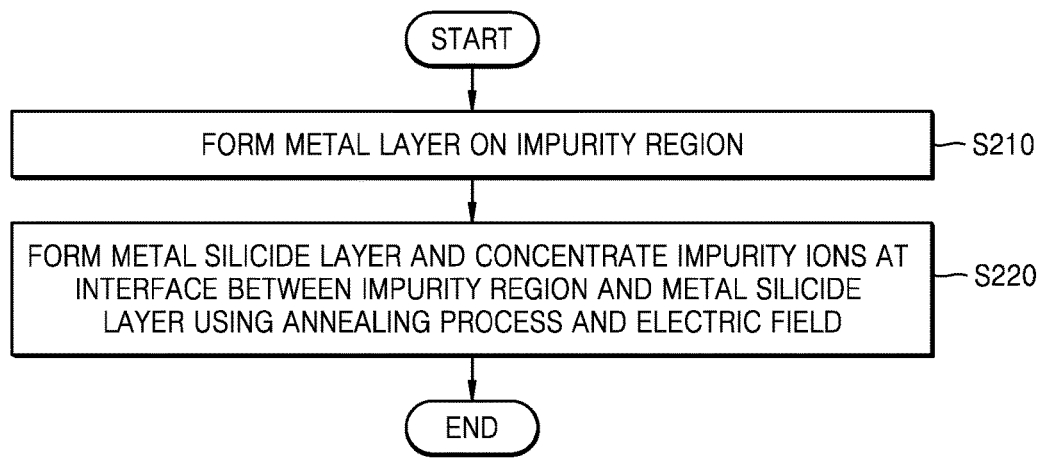
Figure 5:
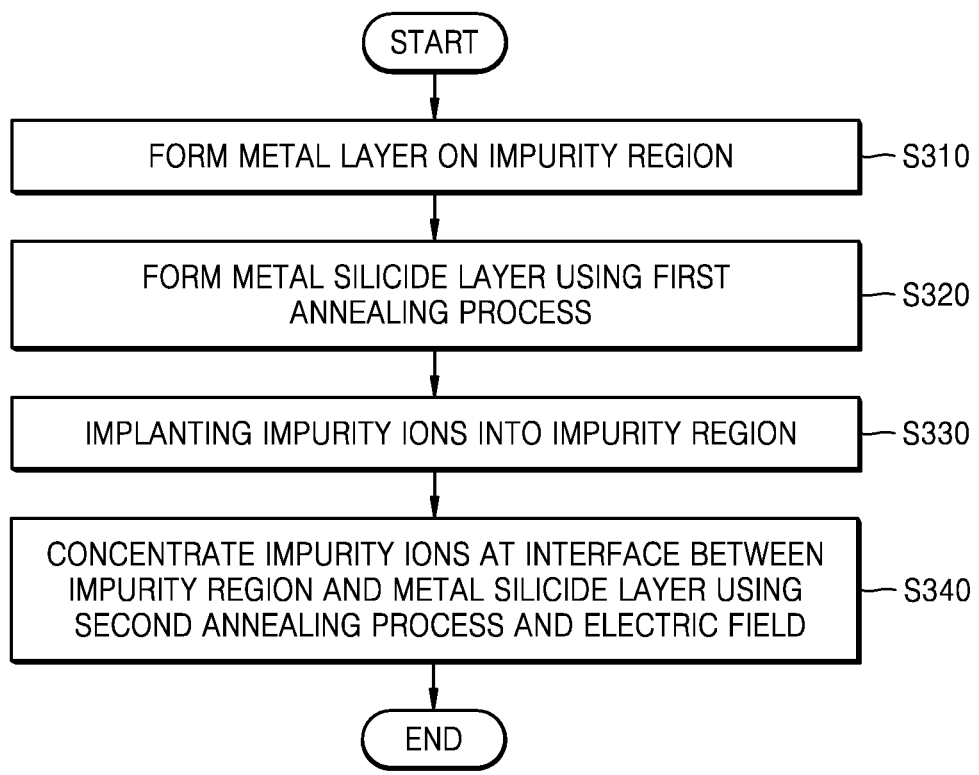

FIGS. 3, 4 and 5 are process flowcharts illustrating methods of fabricating semiconductor devices according to example embodiments using an annealing process accompanied with electric field.

Referring to FIG. 3, a method of fabricating a semiconductor device according to example embodiments may include forming a metal layer on an impurity region in a substrate (see operation S110). The substrate may be a P-type substrate or an N-type substrate. The impurity region may be a heavily doped region that is formed by implanting impurity ions into the substrate and may correspond to the silicon layer or the active layer indicated by reference numeral 130 in FIG. 1A or 2. For example, the impurity region may be a source/drain region that is formed by implanting impurity ions into the substrate. In such a case, the impurity region may be formed to have an impurity concentration of at least $1 \times 10^{20}/cm^3$. For example, the impurity region may be formed to have an impurity concentration in a range of at least $1 \times 10^{20}/cm^3$ to at least $1 \times 10^{21}/cm^3$. The metal layer may be formed of, for example, a cobalt layer or a nickel layer. In example embodiments, a Ti/TiN barrier layer may be additionally formed on the metal layer.

After forming the metal layer, a first annealing process may be applied to the metal layer to form a metal silicide layer (see operation S120). The first annealing process may be performed at a temperature of about 150 degrees Celsius to about 1100 degrees Celsius. In other words, a temperature of the annealing chamber 1100 may be in a range about 150 degrees Celsius to about 1100 degrees Celsius when the first annealing process is applied to the metal layer to form a metal silicide layer. However, a temperature of the first annealing process is not limited to the aforementioned range. After the metal silicide layer is formed, unreacted metal may be removed.

Subsequently, impurity ions may be concentrated at an interface between the impurity region and the metal silicide layer using a second annealing process and electric field (see a step 130). The second annealing process may also be performed at a temperature of about 150 degrees Celsius to about 1100 degrees Celsius. In other words, a temperature of the annealing chamber 1100 may be in a range about 150 degrees Celsius to about 1100 degrees Celsius during the second annealing process. However, a temperature of the second annealing process is not limited to the aforementioned range. A temperature used in the first annealing process may be the same as or different than the temperature used in the second annealing process. For example, a temperature used in the first annealing process may be greater than the temperature of the second annealing process, equal to the temperature of the second annealing process, or less than the temperature of the second annealing process. A voltage, which is equal to or lower than 10 volts may be applied between the impurity region and the metal silicide layer to create electric field across the impurity region. For example, a voltage that is greater than or equal to 1 volt and less than or equal or 10 volts may be applied between the impurity region and the metal silicide layer to create an electric field across the impurity region. The voltage applied between the impurity region and the metal silicide layer is not limited to the aforementioned voltage range. For example, in example embodiments, the voltage applied between the impurity region and the metal silicide layer may be higher than 10 volts. The second annealing process with the electric field may reduce a contact resistance value between the impurity region and the metal silicide layer, as described with reference to FIG. 1.

The impurity ions concentrated at the interface by the second annealing process and the electric field may correspond to impurity ions that are injected into the impurity region using an in-situ doping process while the impurity region is formed or may correspond to other impurity ions that are implanted into the impurity region using a separate ion implantation process after the impurity region is formed. If the impurity ions are implanted into the impurity region using the separate ion implantation process, the separate ion implantation process may be performed before the metal layer is formed or after the metal silicide layer is formed. A detailed description of the separate ion implantation process will be described with reference to FIGS. 5 and 6 later.

Next, the semiconductor device 100a arrayed in the wafer may be completely fabricated using subsequent processes. The subsequent processes may include a deposition process, an etch process, a cleaning process or the like. The deposition process may include a chemical vapour deposition (CVD) process, a sputtering process and a spin coating process. The subsequent processes may further include a packaging process for attaching the semiconductor device 100a to a printed circuit board (PCB) and for encapsulating the semiconductor device 100a with sealant. In addition, the subsequent processes may further include a test step for evaluating characteristics of the semiconductor device 100a or a semiconductor package including the semiconductor device 100a.

Referring to FIG. 4, a method of fabricating a semiconductor device according to example embodiments may include forming a metal layer on an impurity region in a substrate (see operation S210). The substrate, the impurity region and the metal layer may be formed using the same manners as described with reference to FIG. 3.

After forming the metal layer, an annealing process accompanied with electric field may be applied to the substrate including the metal layer to form a metal silicide layer and to concentrate impurity ions at an interface between the impurity region and the metal silicide layer (see operation S220). The annealing process may be performed at a temperature of about 150 degrees Celsius to about 1100 degrees Celsius, like the first or second annealing process described with reference to FIG. 3. Moreover, the electric field may be created by applying a voltage, which is equal to or lower than 10 volts, to a junction between the metal layer and the impurity region.

In example embodiments, the method described with reference to FIG. 4 may be different from the method discussed in FIG. 3 in terms of a manner for forming the metal silicide layer and for concentrating the impurity ions. That is, according to example embodiments, the impurity ions may be concentrated at the interface between the impurity region and the metal silicide layer while the metal silicide layer is formed by the annealing process accompanied with electric field. Alternatively, in example embodiments, as described with reference to FIG. 3, the metal silicide layer may be formed by the first annealing process whereas the impurity ions may be concentrated by the second annealing process accompanied with the electric field which is separated from the first annealing process. Meanwhile, even in a non-limiting example, the impurity ions concentrated at the interface may correspond to impurity ions which are injected into the impurity region using an in-situ doping process while the impurity region is formed or may correspond to other impurity ions which are implanted into the impurity region using a separate ion implantation process after the impurity region is formed. If the impurity ions are implanted into the impurity region using the separate ion implantation process, the separate ion implantation process may be performed before the metal layer is formed.

Referring to FIG. 5, a method of fabricating a semiconductor device according to example embodiments may include forming a metal layer on an impurity region in a substrate (see operation S310). The substrate, the impurity region and the metal layer may be formed using the same manners as described with reference to FIG. 3.

After forming the metal layer, a first annealing process may be applied to the substrate including the metal layer to form a metal silicide layer (see operation S320). The metal silicide layer may also be formed using the same manners as described with reference to FIG. 3. Impurity ions may then be implanted into the impurity region (see operation S330). Specifically, the impurity ions may be implanted into the impurity region after forming a material layer on an entire surface of the substrate, etching the material layer to expose the impurity region, and selectively implanting the impurity ions into the exposed impurity region at a desired (and/or alternatively predetermined) dose with a desired (and/or alternatively predetermined) energy using an implantation apparatus.

After implanting the impurity ions, the impurity ions may be concentrated at an interface between the impurity region and the metal silicide layer using a second annealing process accompanied with electric field (see operation S340). The second annealing process accompanied with the electric field for concentrating the impurity ions may be the same as the second annealing process accompanied with the electric field illustrated in FIG. 3.

FIGS. 6A, 6B, 6C and 6D are cross-sectional views illustrating a method of fabricating a semiconductor device shown in FIG. 5.

Figure 6A:
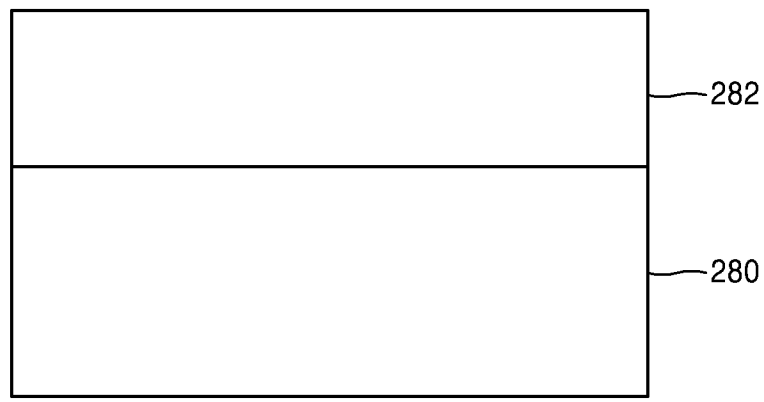
FIGS. 6A, 6B, 6C and 6D are cross-sectional views illustrating a method of fabricating a semiconductor device shown in FIG. 5.

Referring to FIG. 6A, a metal layer 282 may be formed on a semiconductor layer 280. For example, the semiconductor layer 280 may be a polysilicon layer formed on an impurity region. Specifically, the impurity region acting as a source/drain region may be formed by implanting impurity ions into a substrate, and the polysilicon layer may be formed on the impurity region using a deposition process or an epitaxial process. The metal layer 282 may be formed of a cobalt (Co) layer. However, the metal layer 282 is not limited to a cobalt layer.

Figure 6B:
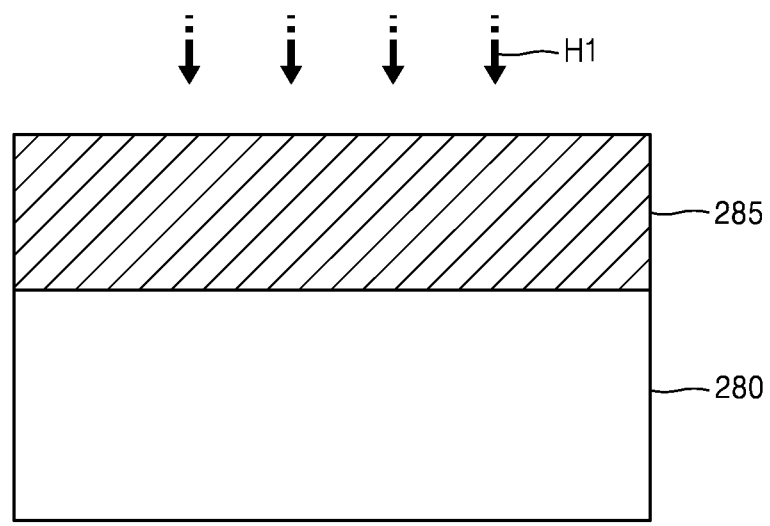

Referring to FIG. 6B, after forming the metal layer 282, a first annealing process H1 may be applied to the metal layer 282 and the semiconductor layer 280 to form a metal silicide layer 285. The first annealing process H1 may be performed at a temperature of about 150 degrees Celsius to about 1100 degrees Celsius. In FIG. 6A, if the semiconductor layer 280 is a polysilicon layer and the metal layer 282 is a cobalt (Co) layer, the metal silicide layer 285 may be a cobalt silicide ($CoSi_x$) layer. However, the metal silicide layer 285 is not limited to a cobalt silicide ($CoSi_x$) layer.

Figure 6C:
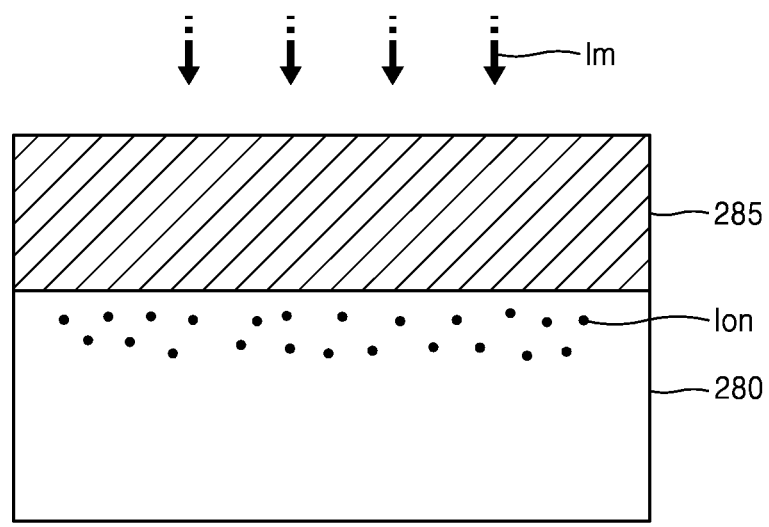

Referring to FIG. 6C, after forming the metal silicide layer 285, impurity ions Ion may be implanted into an upper portion of the semiconductor layer 280 using an ion implantation process Im. FIG. 6C illustrates as if the impurity ions Ion are implanted into an entire surface of the semiconductor layer 280. However, FIG. 6C may merely correspond to an enlarged view of a portion of the semiconductor layer 280. That is, the impurity ions Ion may be selectively implanted into a portion of the semiconductor layer 280 at a wafer level.

More specifically, a material layer acting as an ion implantation mask may be formed on an entire surface of the metal silicide layer 285. The material layer may be patterned using an etch process, thereby exposing a portion of the metal silicide layer 285. The exposed portion of the metal silicide layer 285 may be located on a desired (and/or alternatively predetermined) portion of the semiconductor layer 280 where the impurity ions Ion are implanted. Subsequently, the impurity ions Ion may be implanted into the desired (and/or alternatively predetermined) portion of the semiconductor layer 280, as illustrated in FIG. 6C.

During the ion implantation process Im, the impurity ions Ion may penetrate the metal silicide layer 285 and may reach the upper portion of the semiconductor layer 280. In such a case, the impurity ions Ion may be disorderedly distributed within a desired (and/or alternatively predetermined) depth from an interface between the semiconductor layer 280 and the metal silicide layer 285. This may be due to a poor distribution and diffusion of the impurity ions in the ion implantation process Im.

Figure 6D:
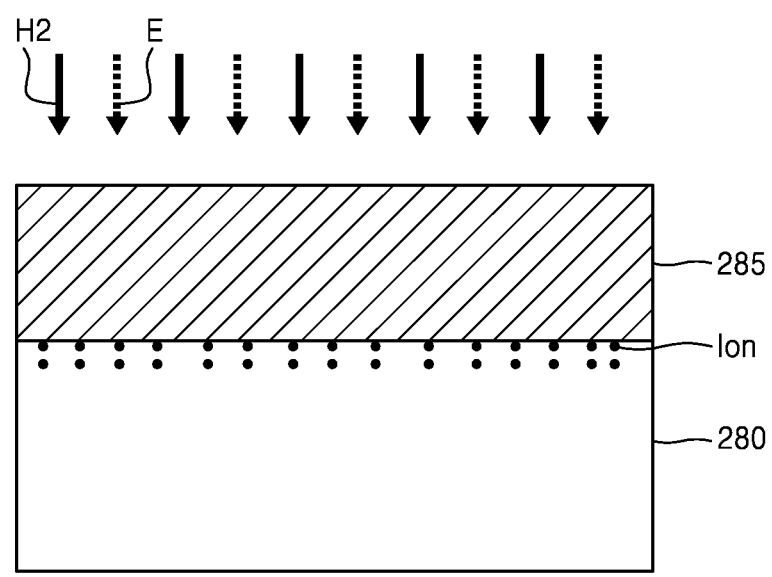

Referring to FIG. 6D, after implanting the impurity ions ION, the impurity ions Ion may be concentrated at the interface between the semiconductor layer 280 and the metal silicide layer 285 by applying a second annealing process H2 and an electric field E to the semiconductor layer 280 and the metal silicide layer 285. The second annealing process H2 may be performed at a temperature of about 150 degrees Celsius to about 1100 degrees Celsius. The electric field E may be created by applying a voltage, which is equal to or lower than 10 volts, to a junction between the metal silicide layer 285 and the semiconductor layer 280. The voltage for creating the electric field E is not limited to the aforementioned range.

As the impurity ions Ion are concentrated at the interface between the semiconductor layer 280 and the metal silicide layer 285 by the second annealing process H2 and the electric field E, the impurity ions Ion may be redistributed to be thin under the interface between the semiconductor layer 280 and the metal silicide layer 285. Accordingly, a concentration of the impurity ions Ion under the interface between the semiconductor layer 280 and the metal silicide layer 285 may increase, and the impurity ions Ion may be stably activated. As a result, a contact resistance value between the semiconductor layer 280 and the metal silicide layer 285 may be reduced.

Figure 7:
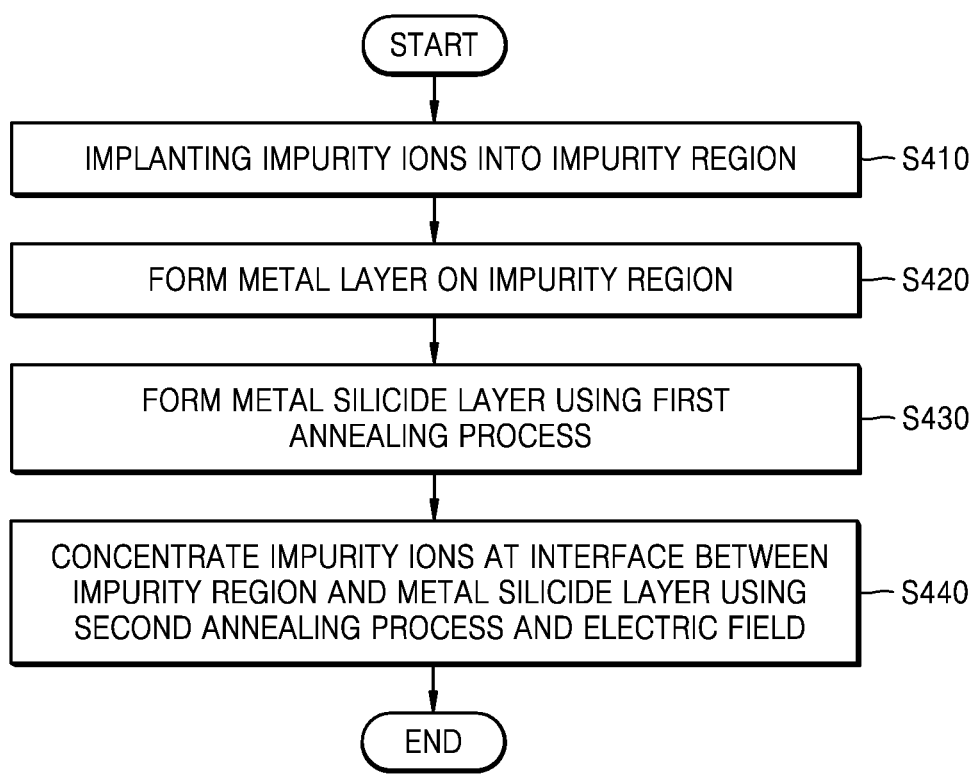
FIGS. 7 and 8 are process flowcharts illustrating methods of fabricating semiconductor devices according to example embodiments using an annealing process accompanied with electric field.
Figure 8:
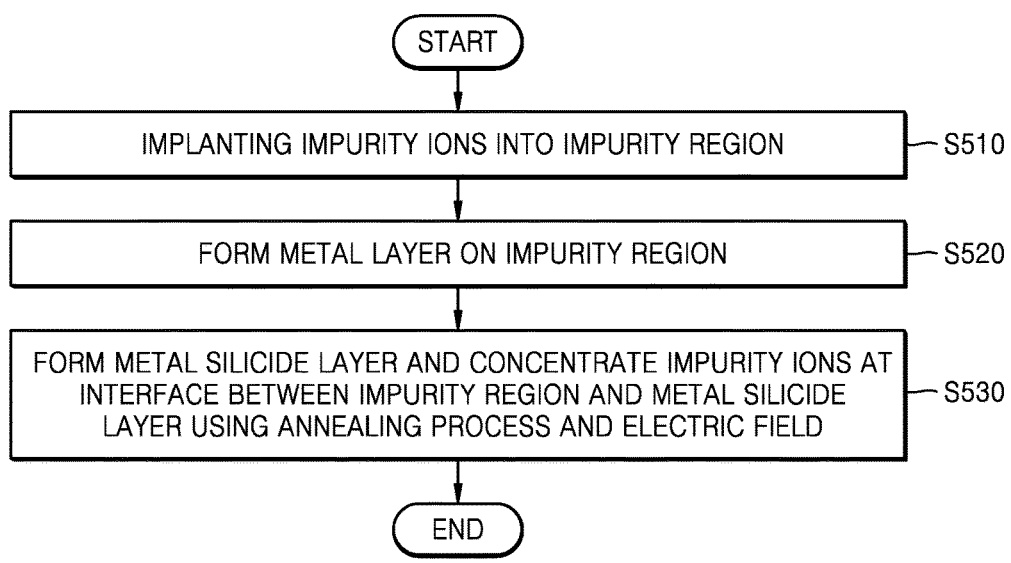

FIGS. 7 and 8 are process flowcharts illustrating methods of fabricating semiconductor devices according to example embodiments using an annealing process accompanied with electric field.

Referring to FIG. 7, a method of fabricating a semiconductor device according to example embodiments may include implanting impurity ions into an impurity region in a substrate (see operation S410). The impurity ions may be implanted using an in-situ process. That is, the impurity ions may be implanted into the impurity region while the impurity region is formed. Alternatively, the impurity ions may be implanted into the impurity region using a separate ion implantation process after the impurity region is formed. If the impurity ions are implanted into the impurity region using the separate ion implantation process, a material pattern acting as an ion implantation mask may be formed on the impurity region and the impurity ions may be selectively implanted into a portion of the impurity region using the material pattern as an ion implantation mask, as described with reference to FIG. 5 or 6C.

Subsequently, a metal silicide layer may be formed on the impurity region and the impurity ions may be concentrated at an interface between the metal silicide layer and the impurity region, using the same manners as illustrated in FIG. 3. That is, a metal layer may be formed on the impurity region (see operation S420) and the metal silicide layer may be formed using a first annealing process (see operation S430). The impurity ions may then be concentrated at an interface between the metal silicide layer and the impurity region using a second annealing process and an electric field (see operation S440).

Referring to FIG. 8, a method of fabricating a semiconductor device according to example embodiments may include implanting impurity ions into an impurity region in a substrate (see operation S510). The impurity ions may be implanted using an in-situ process or a separate ion implantation process, as described with reference to FIG. 7.

Subsequently, a metal silicide layer may be formed on the impurity region and the impurity ions may be concentrated at an interface between the metal silicide layer and the impurity region, using the same manners as illustrated in FIG. 4. That is, a metal layer may be formed on the impurity region (see operation S520), and an annealing process and an electric field may be applied to the substrate including the metal layer to form a metal silicide layer and to concentrate impurity ions at an interface between the impurity region and the metal silicide layer (see operation S530).

Figure 9A:
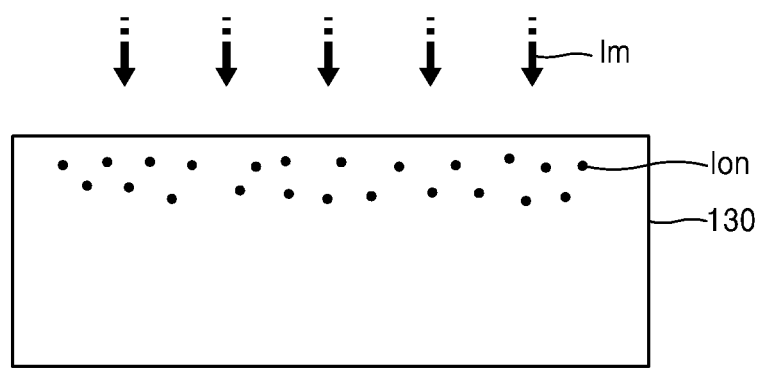
FIGS. 9A, 9B and 9C are cross-sectional views illustrating a method of fabricating a semiconductor device shown in FIG. 8.
Figure 9B:
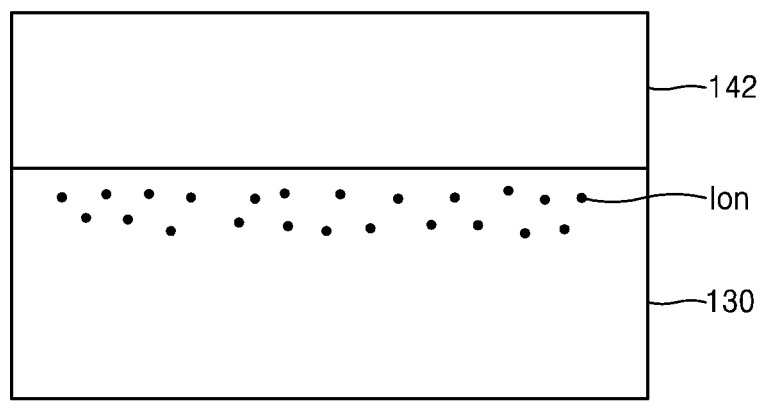
Figure 9C:
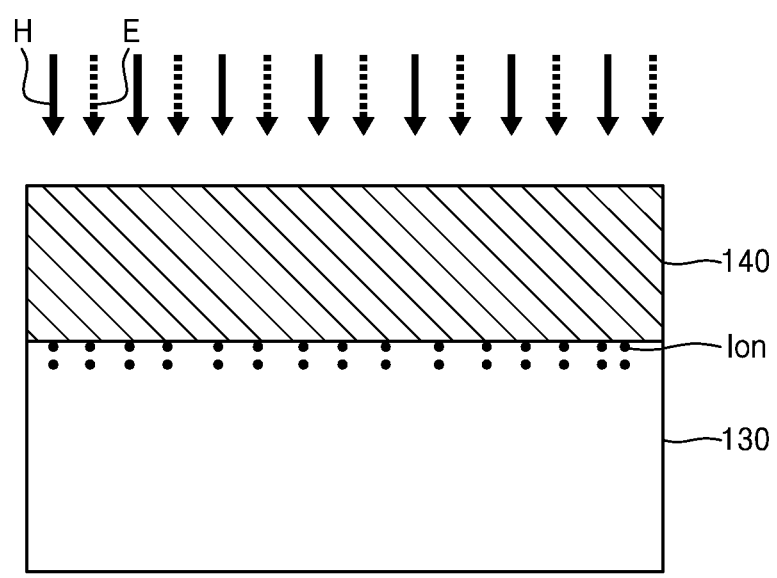

FIGS. 9A, 9B and 9C are cross-sectional views illustrating a method of fabricating a semiconductor device shown in FIG. 8.

Referring to FIG. 9A, impurity ions Ion may be implanted into an active layer 130 using an ion implantation process Im. The active layer 130 may be a silicon (Si) substrate or a silicon germanium (SiGe) substrate. For example, the active layer 130 may correspond to an impurity region such as a source/drain region that is formed by implanting the impurity ions Ion into a silicon (Si) substrate or a silicon germanium (SiGe) substrate. In a non-limiting example, the active layer 130 may correspond to a source/drain region that is formed by implanting impurity ions into a portion of a silicon germanium (SiGe) substrate.

In a non-limiting example, the ion implantation process Im for implanting the impurity ions Ion and an ion implantation process for forming a source/drain region in the active layer 130 may be performed separately. In example embodiments, the impurity ions Ion may be implanted into the active layer 130 using an in-situ process while the active layer 130 is formed. In a non-limiting example, a projection range (Rp) of the ion implantation process Im for implanting the impurity ions Ion may be shallower than a projection range (Rp) of the ion implantation process for forming a source/drain region in the active layer 130.

As described with reference to FIG. 6C, the impurity ions Ion may be disorderedly distributed within a desired (and/or alternatively predetermined) depth from a top surface of the active layer 130. This may be due to a poor distribution and diffusion of the impurity ions in the ion implantation process Im.

Referring to FIG. 9B, after implanting the impurity ions Ion, a metal layer 142 may be formed on the active layer 130. The metal layer 142 may be formed of, for example, a nickel (Ni) layer. The metal layer 142 may react with silicon atoms in the active layer 130 during an annealing process to form a metal silicide layer. If the metal silicide layer is a nickel silicide ($NiSi_x$) layer, the annealing process may be performed at a relatively low temperature. For example, whereas a cobalt silicide layer may be formed using an annealing process performed at a high temperature over 800 degrees Celsius, a nickel silicide layer may be formed using an annealing process performed at a low temperature of about 400 degrees Celsius.

Referring to FIG. 9C, after forming the metal layer 142, an annealing process H accompanied with electric field E may be applied to the substrate including the metal layer 142 to form a metal silicide layer 140 on the active layer 130 and to concentrate the impurity ions Ion at an interface between the active layer 130 and the metal silicide layer 140. If the metal layer 142 is formed of a nickel (Ni) layer, the metal silicide layer 140 may be a nickel silicide layer. The annealing process H may be performed at a temperature of about 150 degrees Celsius to about 1100 degrees Celsius. The electric field E may be created by applying a voltage, which is equal to or lower than 10 volts, to a junction between the metal silicide layer 140 and the active layer 130.

As described above, according to example embodiments, the impurity ions Ion may be concentrated at the interface between the active layer 130 and the metal silicide layer 140 by the electric field E while the metal silicide layer 140 is formed by the annealing process H. As described above, if the metal layer 142 is formed of a nickel layer, the annealing process H for forming the metal silicide layer 140 (e.g., a nickel silicide layer) may be performed at a low temperature of about 400 degrees Celsius. However, the metal layer 142 is not limited to a nickel layer. For example, in example embodiments, the metal layer 142 may be formed of a cobalt layer. In such a case, the annealing process H for forming the metal silicide layer 140 (e.g., a cobalt silicide layer) may be performed at a high temperature over 400 degrees Celsius.

As the impurity ions Ion are concentrated at the interface between the active layer 130 and the metal silicide layer 140 by the annealing process H and the electric field E, the impurity ions Ion may be redistributed to be thin under the interface between the active layer 130 and the metal silicide layer 140. Accordingly, a concentration of the impurity ions Ion under the interface between the active layer 130 and the metal silicide layer 140 may increase, and the impurity ions Ion may be stably activated. As a result, a contact resistance value between the active layer 130 and the metal silicide layer 140 may be reduced.

Figure 10:
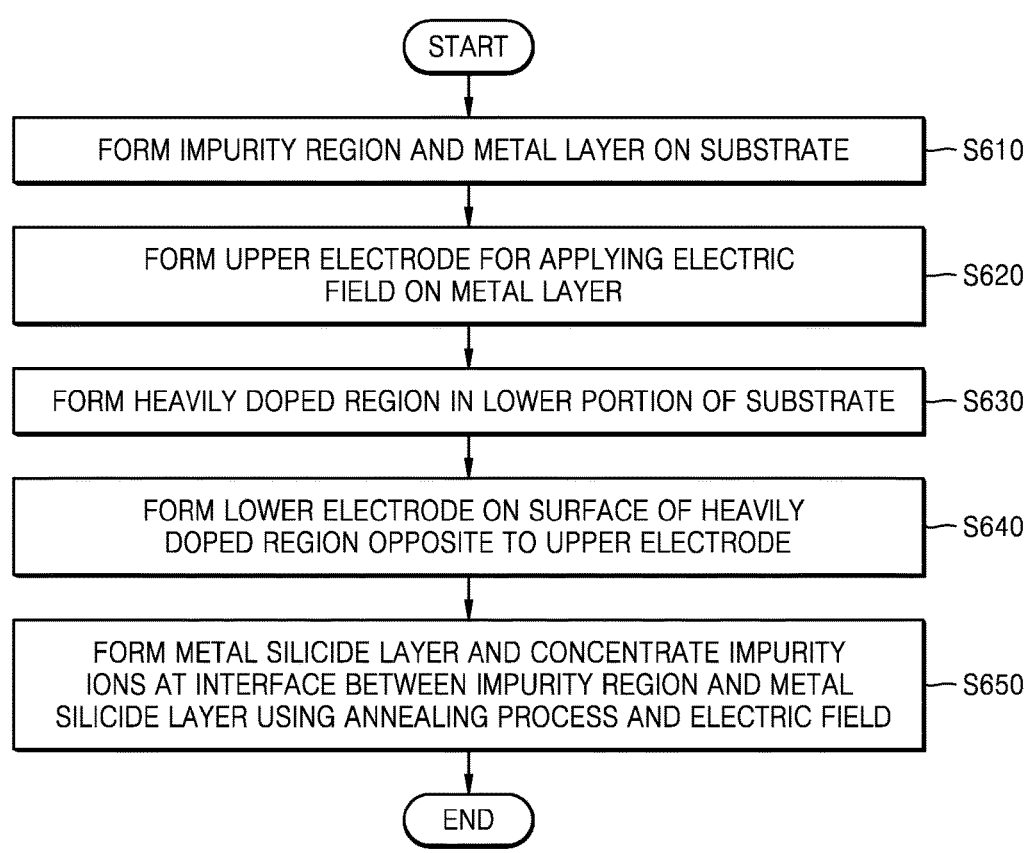
FIGS. 10 and 11 are process flowcharts illustrating methods of fabricating semiconductor devices on a substrate of a wafer level according to example embodiments using an annealing process accompanied with electric field.
Figure 11:
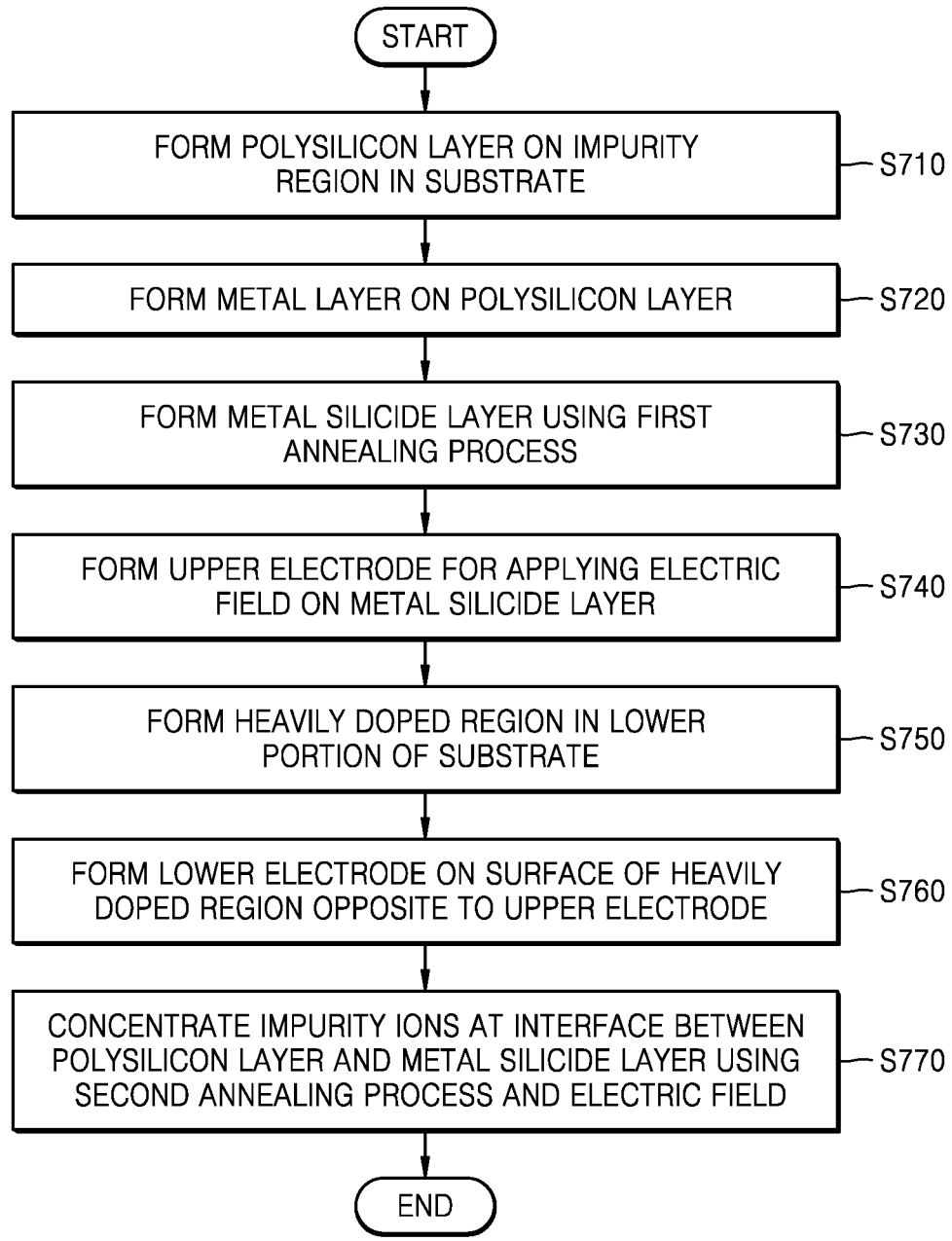

FIGS. 10 and 11 are process flowcharts illustrating methods of fabricating semiconductor devices on a substrate of a wafer level according to example embodiments using an annealing process accompanied with electric field.

Referring to FIG. 10, a method of fabricating a semiconductor device according to example embodiments may include forming an impurity region and a metal layer on a substrate (see operation S610). The substrate may be a P-type or N-type substrate having a wafer form. The impurity region may be formed by implanting impurity ions into the substrate. The metal layer may be formed by depositing metal on the impurity region. The metal layer maybe formed of, for example, a cobalt layer or a nickel layer, but is not limited thereto. In example embodiments, an isolation layer or a gate structure may be additionally formed on the substrate before the metal layer is formed.

An upper electrode for applying an electric field may be formed on the metal layer (see operation S620). The upper electrode may be formed of a refractory metal layer having an excellent process compatibility. In addition, the upper electrode may be formed to have a single-layered structure or a multi-layered structure. For example, the upper electrode may be formed of a combination layer of a titanium (Ti) layer and a titanium nitride (TiN) layer. Alternatively, the upper electrode 150 may be formed to further include a tungsten layer disposed on the Ti/TiN layer. In example embodiments, before the upper electrode is formed, an annealing process may be applied to the metal layer and the impurity region to form a metal silicide layer.

Subsequently, a heavily doped region may be formed in a lower portion of the substrate (see operation S630). The heavily doped region may be formed by implanting impurity ions into the lower portion of the substrate. For example, if the substrate is a P-type substrate, the heavily doped region may be formed by implanting boron ions into the lower portion of the substrate. In such a case, the heavily doped region may be formed to have an impurity concentration of at least $1 \times 10^{19}/cm^3$. For example, the heavily doped region 114 may be formed to have an impurity concentration of at least the impurity region may be formed to have an impurity concentration in a range of at least $1 \times 10^{19}/cm^3$ to at least $1 \times 10^{20}/cm^3$. The heavily doped region may act as an ohmic contact layer between the substrate and a lower electrode to be formed in a subsequent process. That is, the heavily doped region may be formed to reduce (and/or minimize) a voltage drop across the substrate and the lower electrode.

After forming the heavily doped region, the lower electrode may be formed on a surface of the heavily doped region opposite to the upper electrode (see operation S640). The lower electrode may be formed of a refractory metal layer having an excellent process compatibility, like the upper electrode. For example, the lower electrode may be formed of a Ti/TiN layer.

Subsequently, a metal silicide layer may be formed on the impurity region and the impurity ions in the impurity region may be concentrated at an interface between the metal silicide layer and the impurity region, using an annealing process and an electric field (see operation S650). If the metal silicide layer is formed prior to formation of the upper electrode, no additional metal silicide layer may be formed at the operation S650. The impurity ions may be implanted into the substrate using an in-situ doping process while the impurity region is formed or may be implanted into the impurity region using a separate ion implantation process after the impurity region is formed and before the metal layer is formed. Meanwhile, if the metal silicide layer is formed before the upper electrode is formed, the impurity ions may be implanted after the metal silicide layer is formed and before the upper electrode is formed.

In order to form the metal silicide layer and concentrate the impurity ions at the interface between the metal silicide layer and the impurity region using the annealing process and the electric field, the substrate including the lower electrode may be loaded into an annealing chamber and the upper and lower electrodes may be respectively connected to both terminals of a power source. In such a case, the upper and lower electrodes may be respectively connected to both terminals of a power source so that a reverse biased voltage is applied across a Schottky junction between the metal silicide layer and the impurity region.

Referring to FIG. 11, a method of fabricating a semiconductor device according to example embodiments may include forming a polysilicon layer on an impurity region in a substrate (see operation S710). The substrate may be a P-type or N-type substrate having a wafer form. The impurity region may be a source/drain region that is formed by implanting impurity ions into the substrate at a high dose. The polysilicon layer may be formed on the impurity region using a deposition process or an epitaxial process. The polysilicon layer may constitute a buried contact (BC) of a semiconductor device such as a DRAM device. In example embodiments, an isolation layer or a gate electrode may be additionally formed on the substrate before the polysilicon layer is formed.

A metal layer may be formed on polysilicon layer (see operation S720). The metal layer may be formed of, for example, a cobalt layer.

After forming the metal layer, a first annealing process may be applied to the substrate including the metal layer to form a metal silicide layer (see operation S730). The metal silicide layer may be a cobalt silicide layer. The first annealing process may be performed at a temperature of about 150 degrees Celsius to about 1100 degrees Celsius. If the metal layer is formed of a cobalt layer, the first annealing process may be performed at a high temperature over 800 degrees Celsius.

Subsequently, an upper electrode, a heavily doped region and a lower electrode may be formed using the same or similar manners as described with reference to FIG. 10. That is, the upper electrode for applying an electric field may be formed on the metal silicide layer (see operation S740), the heavily doped region may be formed in a lower portion of the substrate (see operation S750), and the lower electrode may be formed on a surface of the heavily doped region opposite to the upper electrode (see operation S760).

After forming the lower electrode, the impurity ions in the polysilicon layer may be concentrated at an interface between the metal silicide layer and the polysilicon layer using a second annealing process and an electric field (see operation S770). The second annealing process may be performed at a temperature of about 150 degrees Celsius to about 1100 degrees Celsius, and electric field may be created by applying a voltage, which is equal to or lower than 10 volts, to a junction between the metal silicide layer and the polysilicon layer.

Figure 12:
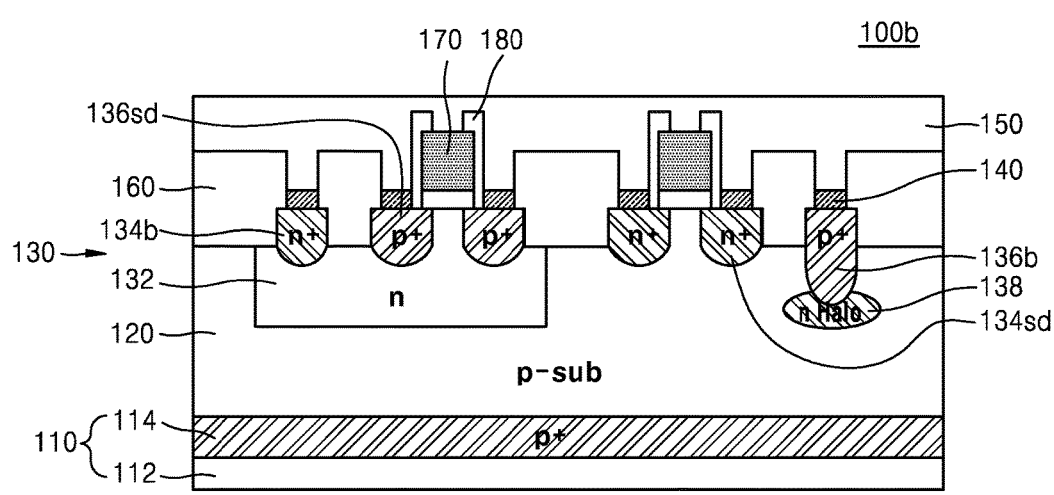
FIG. 12 is a cross-sectional view illustrating a semiconductor device of a wafer level to which electric field is applied according to example embodiments.

FIG. 12 is a cross-sectional view illustrating a semiconductor device 100*b* of a wafer level to which electric field is applied according to example embodiments.

Referring to FIG. 12, the semiconductor device 100*b* may include an ohmic contact layer 110, a substrate 120, an active layer 130, a metal silicide layer 140, an upper electrode 150, an insulation layer 160 and gate electrodes 170.

The ohmic contact layer 110 may include a lower electrode 112 and a heavily doped region 114. The lower electrode 112 may be formed of a refractory metal layer having an excellent process compatibility. For example, the lower electrode 112 may be formed of a Ti/TiN layer. The heavily doped region 114 may be formed by implanting impurity ions into a lower portion of the substrate 120 at a high dose. For example, if the substrate 120 is a P-type substrate, the heavily doped region 114 may be formed by implanting boron ions into a lower portion of the substrate 120 at a high dose. In example embodiments, the heavily doped region 114 may be excluded from the ohmic contact layer 110 or may be regarded as a portion of the substrate 120.

The substrate 120 may be a P-type substrate or an N-type substrate. In a non-limiting example, the substrate 120 may be a P-type substrate. More specifically, the substrate 120 may be a P-type silicon germanium (SiGe) substrate.

The active layer 130 may include various impurity regions. Specifically, if the substrate 120 is a P-type substrate, the active layer 130 may include an N-type well 132, an N-type heavily doped region 134*b* in the N-type well 132, and P-type heavily doped regions 136*sd* in the N-type well 132. The active layer 130 may further include N-type heavily doped regions 134*sd* in the substrate 120, a P-type heavily doped region 136*b* in the substrate 120, and an N-type halo region 138 disposed under the P-type heavily doped region 136*b*.

The N-type well 132 may have an impurity concentration which is higher than an impurity concentration of the substrate 120 and which is lower than impurity concentrations of the P-type heavily doped regions 136*sd* and the N-type heavily doped region 134*b*. For example, the N-type well 132 may be formed by implanting phosphorus ions or arsenide ions into the substrate 120 to have an impurity concentration of about $1 \times 10^{15}/cm^3$ to about $2 \times 10^{19}/cm^3$. The N-type heavily doped region 134*b* may be formed by implanting N-type impurity ions into the N-type well 132 at a high dose. For example, the N-type heavily doped region 134*b* may be formed to have an impurity concentration of at least about $1 \times 10^{20}/cm^3$. The P-type heavily doped regions 136*sd* may be formed by implanting P-type impurity ions into the N-type well 132 at a high dose. For example, the P-type heavily doped regions 136*sd* may be formed to have an impurity concentration of at least about $1 \times 10^{20}/cm^3$. For example, the heavily doped region 134*b* and/or 136*sd* may be formed to have an impurity concentration in a range of at least $1 \times 10^{20}/cm^3$ to at least $1 \times 10^{21}/cm^3$.

The N-type well 132, the N-type heavily doped region 134*b*, and the P-type heavily doped regions 136*sd* may constitute a P-channel MOS (PMOS) transistor. For example, the N-type heavily doped region 134*b* may act as a body contact region (or a body pick-up region) of the PMOS transistor, and the P-type heavily doped regions 136*sd* may act as source/drain regions of the PMOS transistor. Meanwhile, the substrate 120, the N-type heavily doped regions 134*sd*, and the P-type heavily doped region 136*b* may constitute an N-channel MOS (NMOS) transistor. For example, the N-type heavily doped regions 134*sd* may act as source/drain regions of the NMOS transistor, and the P-type heavily doped region 136*b* may act as a body contact region (or a body pick-up region) of the NMOS transistor. As described above, the semiconductor device 100*b* may be configured to have a CMOS circuit including the PMOS transistor and the NMOS transistor. For example, the semiconductor device 100*b* may be configured to be a CMOS logic device.

The N-type halo region 138 may be formed in the substrate 120 to contact a lower portion of the P-type heavily doped region 136*b*. If the annealing process accompanied with electric field is applied to the semiconductor device 100*b*, the P-type heavily doped region 136*b* and the metal silicide layer 140 on the P-type heavily doped region 136*b* may provide a forward biased Schottky junction. In such a case, a leakage current may flow through the forward biased Schottky junction. However, the N-type halo region 138 may limit and/or stop the leakage current from flowing through the forward biased Schottky junction. The N-type halo region 138 may be formed to provide a P-N junction with the P-type heavily doped region 136*b* and to have a planar area that is greater than a planar area of the P-type heavily doped region 136*b* in a plan view.

The metal silicide layer 140 may be formed on each of the impurity regions 134*b*, 134*sd*, 136*b* and 136*sd*. The metal silicide layer 140 may contact the impurity regions 134*b*, 134*sd*, 136*b* and 136*sd* to provide Schottky junctions, and the Schottky junctions may be forward-biased or reverse-biased according to a direction of electric fields applied thereto. Current flowing through the Schottky junctions and ohmic contact and the electric fields created across the Schottky junctions will be described more fully with reference to FIG. 13.

The upper electrode 150 may be formed on an entire top surface of the substrate including the PMOS transistor and the NMOS transistor and may be electrically connected to the metal silicide layer 140. The upper electrode 150 may be formed of a refractory metal layer having excellent process compatibility. In addition, the upper electrode 150 may be formed to have a single-layered structure or a multi-layered structure. For example, the upper electrode 150 may be formed of a combination layer of a titanium (Ti) layer and a titanium nitride (TiN) layer. The upper electrode 150 may further include a tungsten layer disposed on the Ti/TiN layer.

The insulation layer 160 may be formed of an oxide layer, a nitride layer or an oxynitride layer. The insulation layer 160 may be formed to have a single-layered structure or a multi-layered structure. Moreover, the insulation layer 160 may act as an isolation layer that electrically insulates elements such as the transistors from each other. The gate electrodes 170 may be formed of a conductive layer. For example, the gate electrodes 170 may be formed of a metal layer or a polysilicon layer. A gate dielectric layer may be disposed between each gate electrode 170 and the active layer 130. Spacers 180 may be formed on sidewalls of the gate electrodes 170, and a capping layer may be formed on a top surface of each gate electrode 170. The gate dielectric layer, the spacers, the capping layer and the gate electrode 170 may constitute a gate structure.

Figure 13:
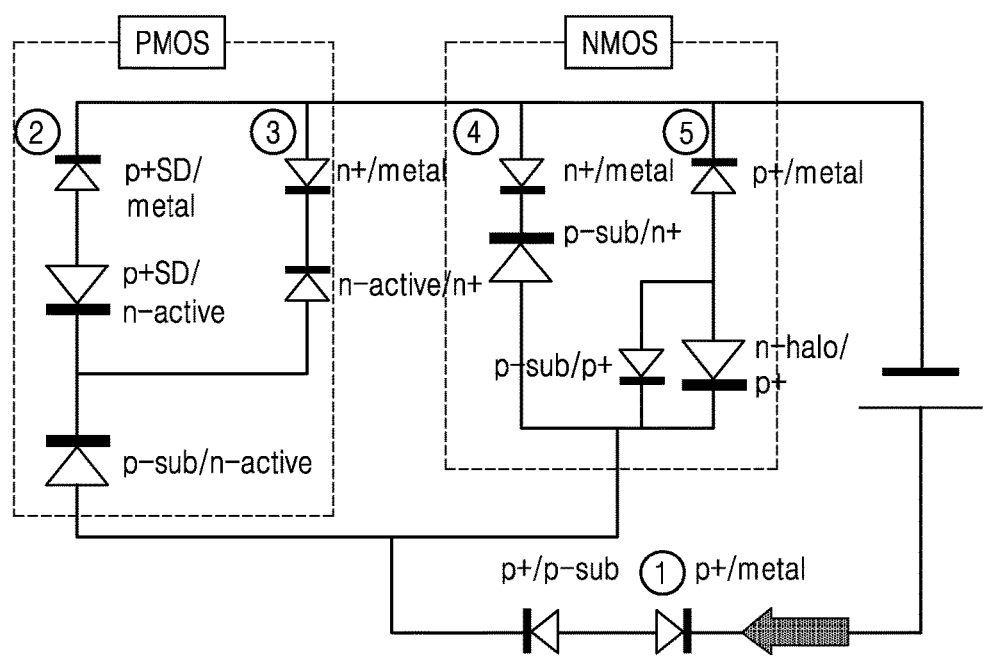
FIG. 13 is an equivalent circuit diagram illustrating junctions in the semiconductor device shown in FIG. 12.

FIG. 13 is an equivalent circuit diagram illustrating junctions in the semiconductor device 100*b* shown in FIG. 12.

Referring to FIGS. 12 and 13, the metal silicide layer 140 may contact the P-type heavily doped regions 136*sd* to provide a forward-biased Schottky junction ② (p+SD/metal) in a PMOS transistor region, and the metal silicide layer 140 may contact the N-type heavily doped regions 134*b* to provide a reverse-biased Schottky junction ③

(n+/metal) in the PMOS transistor region. Meanwhile, an N/N+ junction (n-active/n+) may be present between the N-type well 132 and the N-type heavily doped regions 134*b* in the PMOS transistor region. The N/N+ junction may be provided due to a Fermi level difference between the N-type well 132 and the N-type heavily doped regions 134*b*. A P/N (p+SD/n-active) junction may be provided between the P-type heavily doped regions 136*sd* and the N-type well 132 in the PMOS transistor region. In addition, a P/N junction (p-sub/n-active) may be provided between the substrate 120 and the N-type well 132 in the PMOS transistor region.

In an NMOS transistor region, the metal silicide layer 140 may contact the N-type heavily doped regions 134*sd* to provide a reverse-biased Schottky junction ④ (n+/metal), and the metal silicide layer 140 may contact the P-type heavily doped regions 136*b* to provide a forward-biased Schottky junction ⑤ (p+/metal). Moreover, a P/N junction (p-sub/n+) junction may be provided between the N-type heavily doped regions 134*sd* and the substrate 120 in the NMOS transistor region, and a P/P+ junction (p-sub/p+) may be present between the substrate 120 and the P-type heavily doped regions 136*b* in the NMOS transistor region. The P/P+ junction may be provided due to a Fermi level difference between the substrate 120 and the P-type heavily doped regions 136*b*. Meanwhile, a P/N junction (n-halo/p+) may be provided between the N-type halo region 138 and the P-type heavily doped regions 136*b* in the NMOS transistor region.

A junction (p+/p-sub) may be provided between the heavily doped region 114 and the substrate 120. The junction (p+/p-sub) may be provided due to a Fermi level difference between the heavily doped region 114 and the substrate 120. A reverse-biased Schottky junction ① (p+/metal) may be provided between the heavily doped region 114 and the lower electrode 112. If an impurity concentration of the heavily doped region 114 is appropriately controlled, the reverse-biased Schottky junction ① (p+/metal) may exhibit almost an ohmic contact characteristic. In such a case, a voltage drop across the reverse-biased Schottky junction ① (p+/metal) may be reduced (and/or minimized). For example, if the substrate 120 is a P-type substrate, boron ions may be implanted into the substrate 120 at a high dose to form the heavily doped region 114 having an impurity concentration of at least about $1 \times 10^{19}/cm^3$. For example, the heavily doped region 114 may be formed to have an impurity concentration of at least the impurity region may be formed to have an impurity concentration in a range of at least $1 \times 10^{19}/cm^3$ to at least $1 \times 10^{20}/cm^3$. In such a case, the reverse-biased Schottky junction ① (p+/metal) may exhibit almost an ohmic contact characteristic.

If the annealing process accompanied with the electric field is applied to the semiconductor device 100*b*, current may flow in a direction indicated by an arrow in the semiconductor device 100*b*. That is, during the annealing process accompanied with the electric field, most of a voltage applied to the semiconductor device 100*b* may be applied to the reverse-biased Schottky junctions ③ and ④ to concentrate the impurity ions in the vicinity of the reverse-biased Schottky junctions ③ and ④ because the reverse-biased Schottky junction ① exhibits almost an ohmic contact characteristic. Meanwhile, during the annealing process accompanied with the electric field, an influence on dopants in the forward-biased Schottky junction ② may be neglected because a reverse bias is applied to the P/N (p+SD/n-active) junction connected head-to-head to the forward-biased Schottky junction ② to cause a hole passivation phenomenon or a hole accumulation phenomenon. In addition, during the annealing process accompanied with the electric field, an influence on dopants in the forward-biased Schottky junction ⑤ may be neglected because the N-type halo region 138 suppresses the leakage current that flows through the P-type heavily doped region 136*b*. As a result, during the annealing process accompanied with the electric field, the leakage current flowing through the forward-biased Schottky junctions ② and ⑤ may be neglected.

Figure 14:
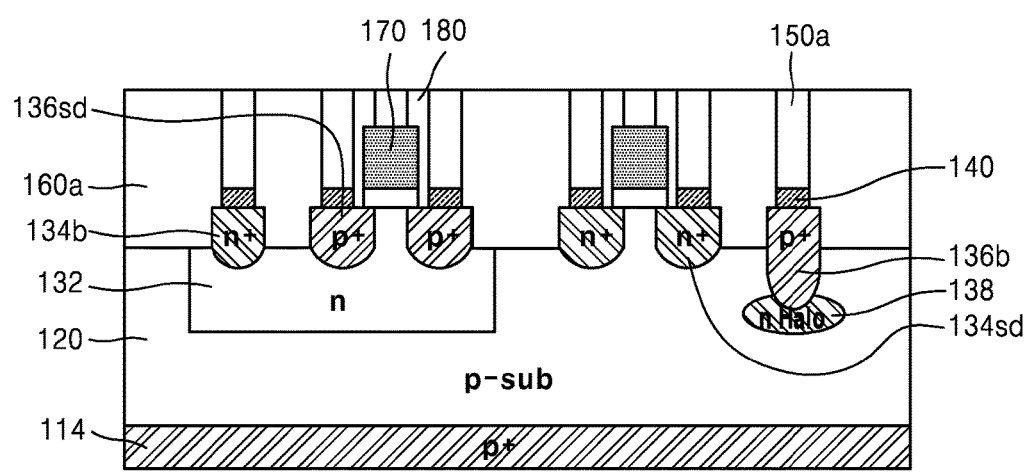
FIG. 14 is a cross-sectional view illustrating a semiconductor device fabricated by a CMOS process according to example embodiments.

FIG. 14 is a cross-sectional view illustrating a semiconductor device fabricated according to example embodiments.

Referring to FIG. 14, after the annealing process accompanied with the electric field is performed, the lower electrode 112 and the upper electrode 150 illustrated in FIG. 13 may be removed to realize a semiconductor device, for example, a logic device including a CMOS circuit.

The upper electrode 150 may be formed to include a Ti/TiN layer and a tungsten (W) layer. In such a case, an entire portion of the upper electrode 150 may not be removed. For example, a node separating process for the upper electrode 150 may be performed to leave portions of the upper electrode 150 on the meal silicide layers 140 and the gate electrodes 170. The left portions of the upper electrode 150 may be used as metal electrodes 150*a* which are electrically connected to the meal silicide layers 140. The node separating process for forming the metal electrodes 150*a* may be performed using a chemical mechanical polishing (CMP) process or a lithography process.

In example embodiments, the lower electrode 112 may not be removed. If the lower electrode 112 remains, a passivation layer having an insulation property may be formed to cover the lower electrode 112.

FIG. 14 basically illustrates a planar type CMOS structure, but inventive concepts are not limited thereto. For example, in example embodiments, the semiconductor device according to the embodiment may be realized to have a three-dimensional CMOS structure including three-dimensional transistors such as fin type field effect transistors (fin-FETs). More specifically, if the semiconductor device is realized to have a CMOS structure including fin-FETs, the impurity regions (e.g., the active layer) may be formed to have a fin-shaped body protruding from a substrate and the gate structure may be formed to cover two opposite sidewalls and a top surface of the fin-shaped body. In order to apply the annealing process accompanied with the electric field to the three-dimensional semiconductor device including the fin-FETs, a heavily doped region may be formed in a lower portion of a substrate and an N-type halo region may be formed under a P-type heavily doped region constituting a forward-biased Schottky junction in an NMOS transistor region. A metal silicide layer may also be formed between an active layer and a metal electrode, and impurity ions may be concentrated at an interface between the active layer and the metal silicide layer to reduce a contact resistance value.

Figure 15A:
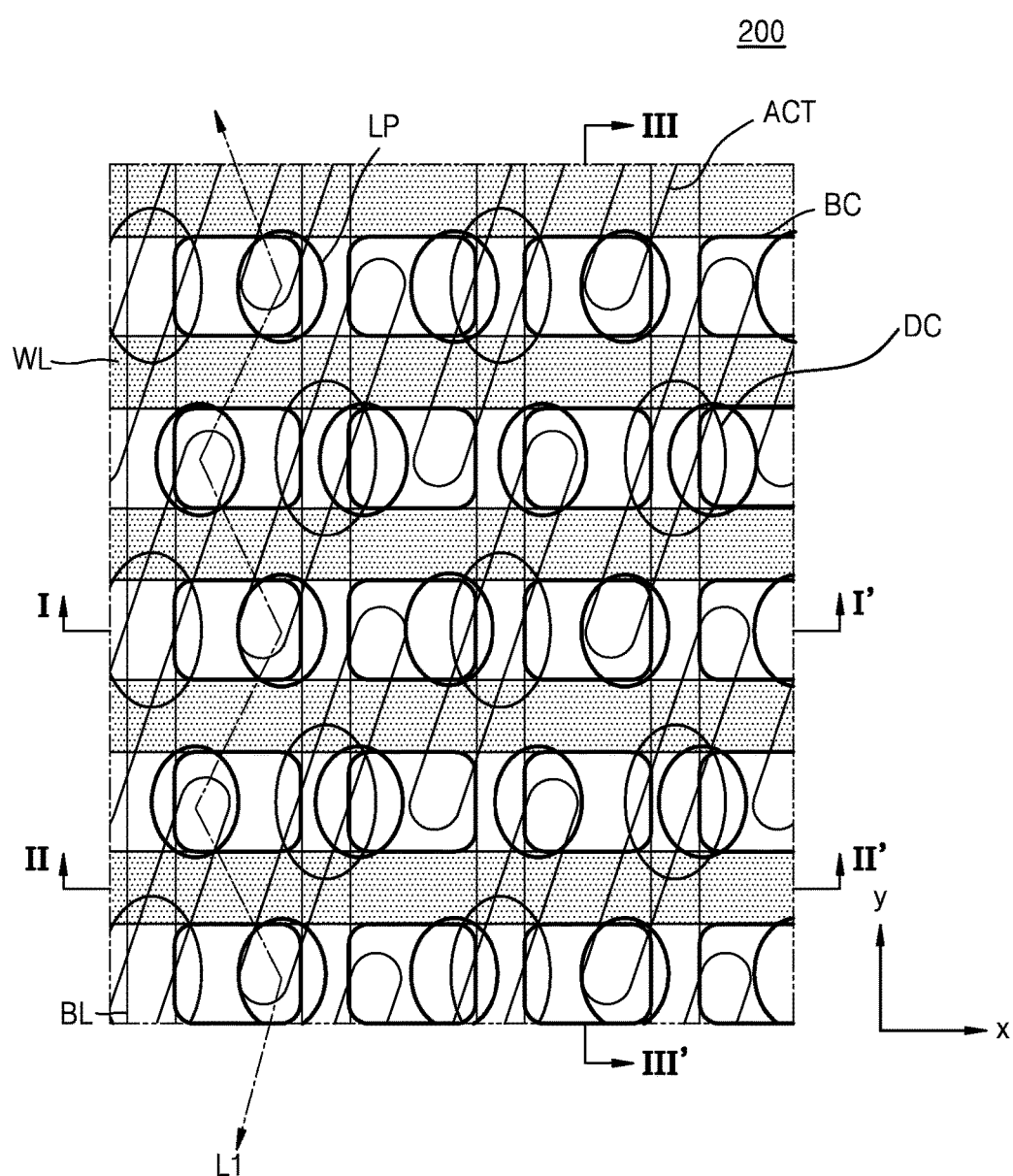
FIG. 15A is a plan view illustrating a dynamic random access memory (DRAM) device according to example embodiments.
Figure 15B:
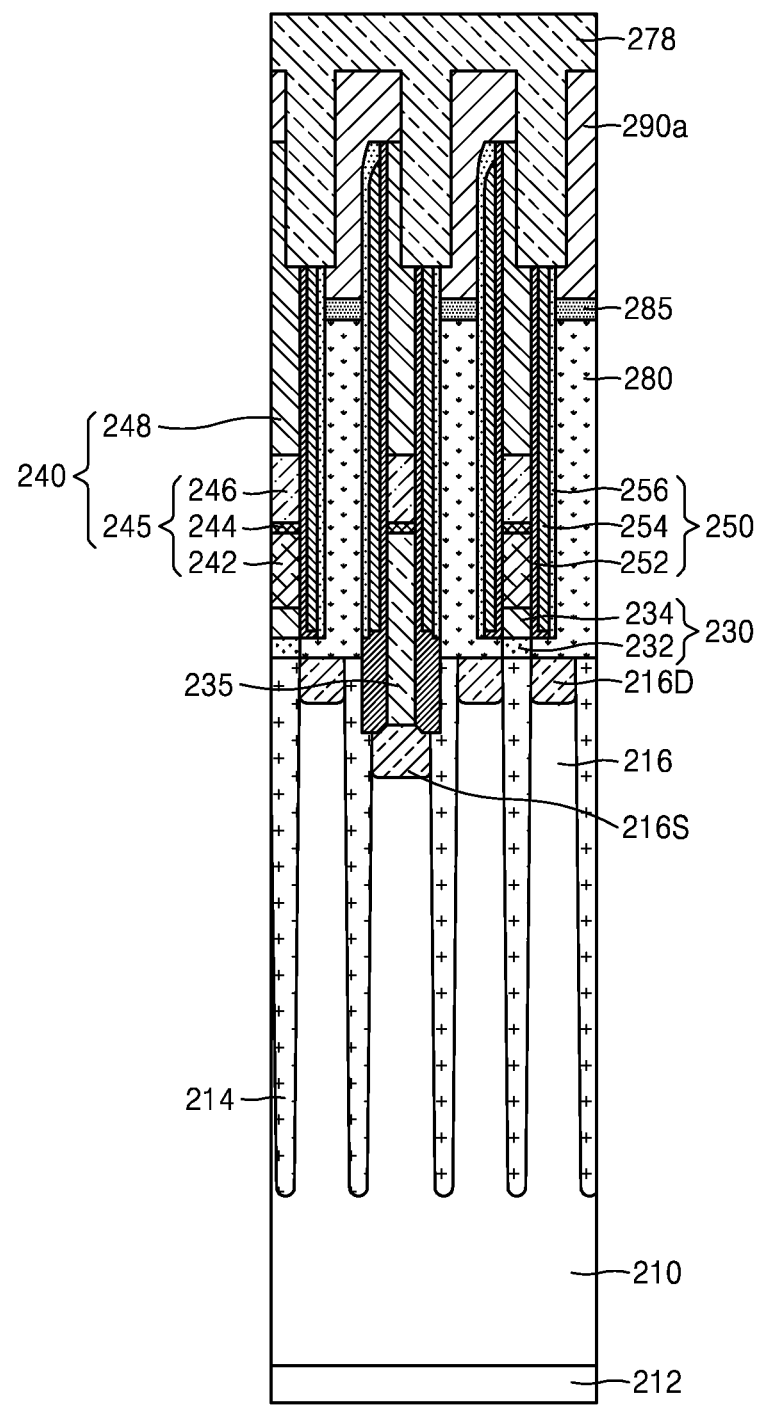
FIGS. 15B, 15C and 15D are cross-sectional views taken along lines I-I', II-II' and III-III' of FIG. 15A, respectively.
Figure 15C:
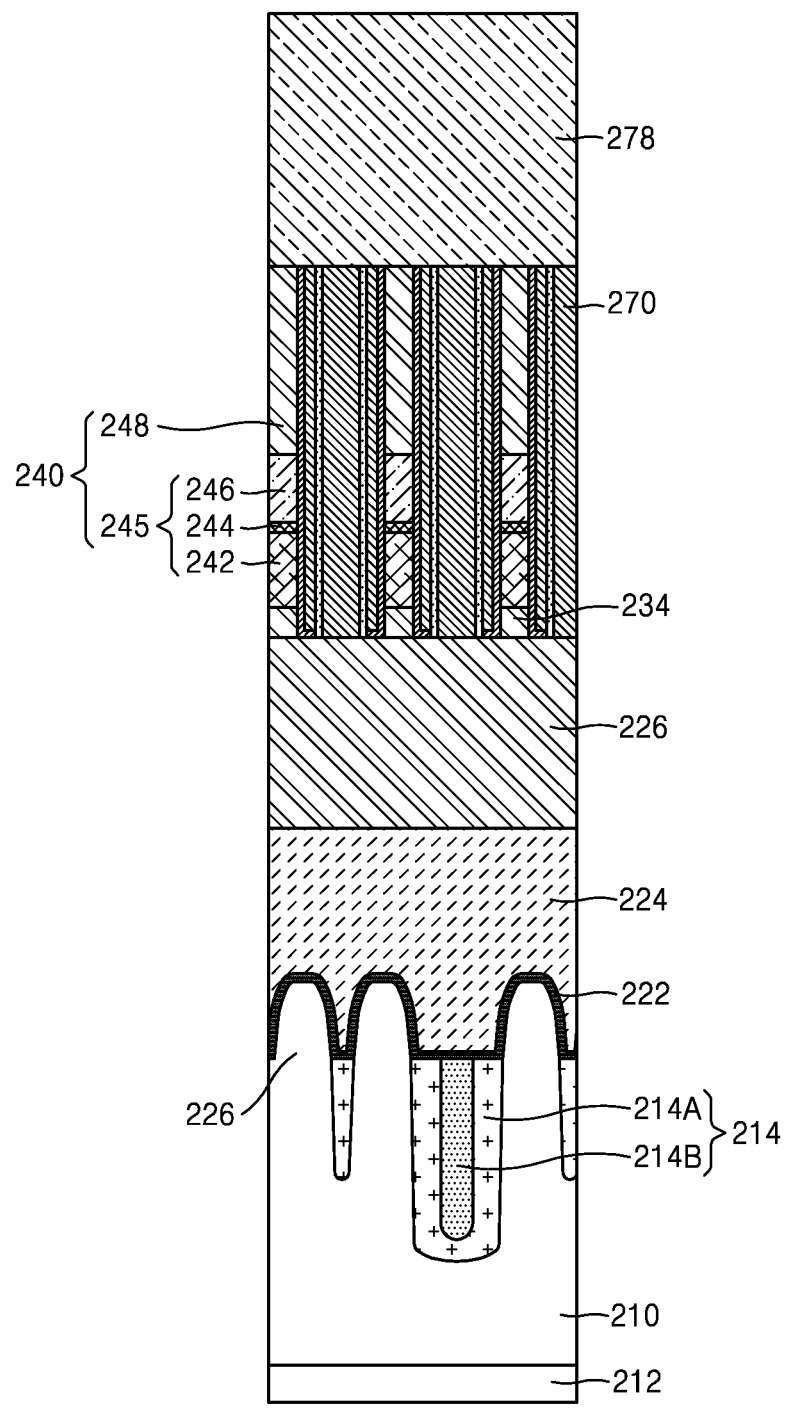
Figure 15D:
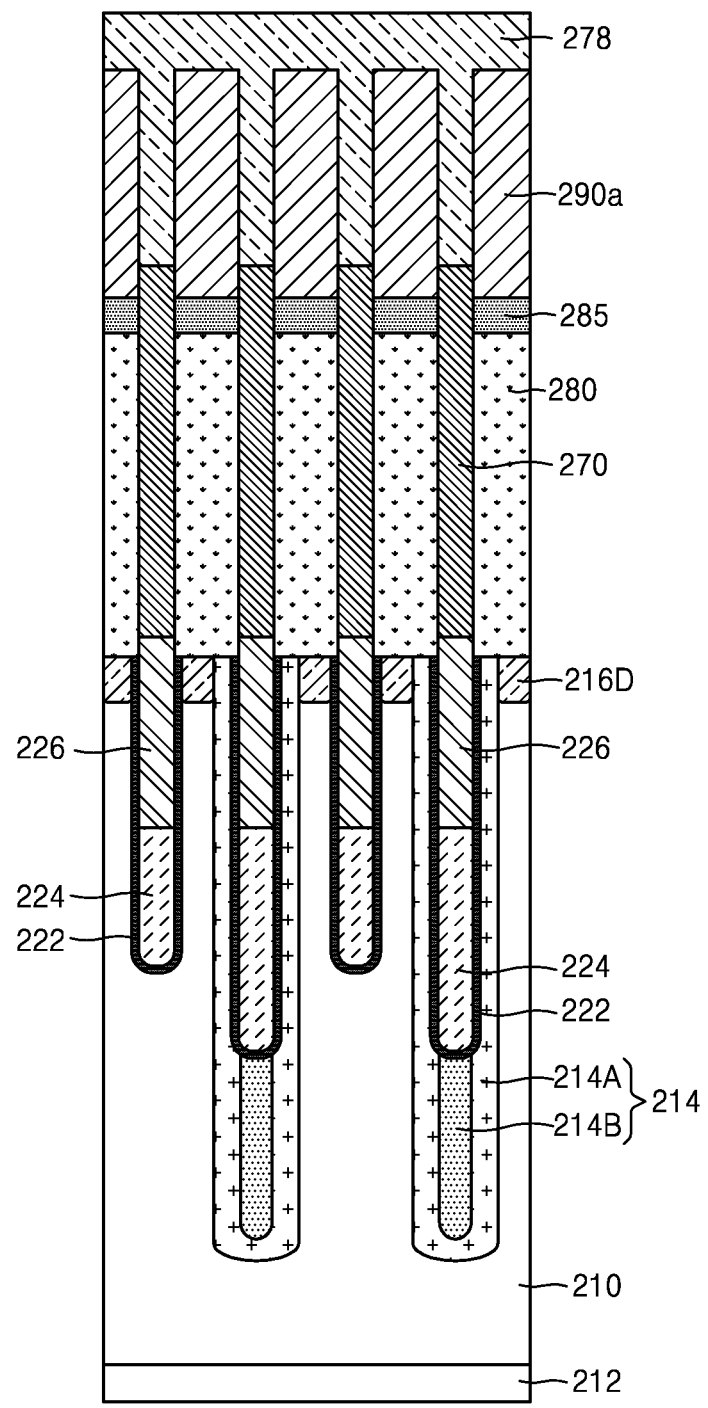

FIG. 15A is a plan view illustrating a dynamic random access memory (DRAM) device 200 according to example embodiments. FIGS. 15B, 15C and 15D are cross-sectional views taken along lines I-I', II-II' and III-III' of FIG. 15A, respectively.

Referring to FIGS. 15A, 15B, 15C and 15D, the DRAM device 200 may include a plurality of active regions (ACT) 216. The plurality of active regions (ACT) 216 may be defined by an isolation layer 214 formed in a substrate 210. As design rules of semiconductor devices are reduced, the active regions (ACT) 216 having a bar shape may be disposed to be parallel with a diagonal direction as illustrated in FIG. 15A. A plurality of parallel word lines (WL)

224 may be disposed on the active regions (ACT) 216 to extend in a second direction (e.g., an x-axis direction) and to intersect the active regions (ACT) 216. A plurality of parallel bit lines (BL) 245 may be disposed on the word lines (WL) 224 to extend in a first direction (e.g., a y-axis direction) and to intersect the word lines (WL) 224.

The substrate 210 may be a P-type substrate or an N-type substrate and may have the same configuration as described with reference to FIG. 2. The isolation layer 214 may be formed of a single-layered insulation layer or a multi-layered insulation layer including an exterior insulation layer 214A and an interior insulation layer 214B. The active regions (ACT) 216 may be separated from each other by the isolation layer 214, and heavily doped regions may be disposed in upper regions of the active regions (ACT). For example, source regions 216S and drain regions 216D may be disposed in upper regions of the active regions (ACT).

A heavily doped region 212 may be formed in a lower portion of the substrate 210. The heavily doped region 212 may be formed to provide ohmic contact while an annealing process accompanied with electric field is performed. The heavily doped region 212 may be formed by implanting impurity ions into the substrate 210, and a conductivity type of the impurity ions may be determined according to a conductivity type of the substrate 210.

The word lines 224 may be formed to be buried in the substrate 210, and top surfaces of the word lines 224 may be located at a level which is lower than a top surface of the substrate 210. A bottom surface of each of the word lines 224 may have an uneven profile, as illustrated in FIG. 15C. Saddle fin-FETs may be formed on the active regions 216. In example embodiments, the word lines 224 may be formed to include at least one selected from the group consisting of a titanium (Ti) layer, a titanium nitride (TiN) layer, a tantalum (Ta) layer, a tantalum nitride (TaN) layer, a tungsten (W) layer, a tungsten nitride (WN) layer, a titanium silicon nitride (TiSiN) layer and a tungsten silicon nitride (WSiN) layer.

A gate dielectric layer 222 may be disposed between the word lines 224 and the active regions 216. The gate dielectric layer 222 may be formed to include at least one selected from the group consisting of a silicon oxide (SiO) layer, a silicon nitride (SiN) layer, a silicon oxynitride (SiON) layer, an oxide/nitride/oxide (O/N/O) layer and a high-k dielectric layer. The high-k dielectric layer means a dielectric layer having a dielectric constant which is higher than a dielectric constant of a silicon oxide layer. In example embodiments, the gate dielectric layer 222 may be formed of a dielectric layer having a dielectric constant of about 10 to about 25.

A buried insulation layer 226 may be formed on the word lines 224, and a top surface of the buried insulation layer 226 may be substantially coplanar with a top surface of the substrate 210. The buried insulation layer 226 may be formed to include at least one selected from the group consisting of a silicon oxide (SiO) layer, a silicon nitride (SiN) layer and a silicon oxynitride (SiON) layer.

An interlayer insulation pattern 230 may be formed on the substrate 210. The interlayer insulation pattern 230 may be formed to include a silicon oxide layer 232 and a silicon nitride layer 234. In example embodiments, the interlayer insulation pattern 230 may be formed of only a silicon oxide layer. For example, the interlayer insulation pattern 230 may be formed of a tetra-ethyl-ortho-silicate (TEOS) layer, a high density plasma (HDP) oxide layer, or a borophosphosilicate glass (BPSG) layer.

The DRAM device 200 may include various contacts on the active regions 216. For example, the DRAM device 200 may include direct contacts (DC) 235, buried contacts (BC) 280 and landing pads (LP) 290a which are disposed on the active regions 216. The direct contacts 235 may electrically connect the active regions 216 to the bit lines 245, and the buried contacts 280 may electrically connect the active regions 216 to lower electrodes (not shown) of capacitors.

The direct contacts 235 may contact the source regions 216S of the active regions 216, and lower portions of the direct contacts 235 may be surrounded by spacers. The spacers may be formed of a material which is different from the isolation layer 214.

A plurality of parallel bit line structures 240 may be disposed on the interlayer insulation pattern 230 and the direct contacts 235 to extend in the second direction (e.g., the x-axis direction). Each of the bit line structures 240 may include the bit lines 245 and a capping line 248 covering a top surface of the bit line 245. The bit lines 245 may be electrically connected to the direct contacts 235.

In example embodiments, the bit lines 245 may be formed to include at least one selected from the group consisting of a doped semiconductor layer, a metal layer, a metal nitride layer and a metal silicide layer. Each of the bit lines 245 may be formed to have a single-layered structure or a multi-layered structure. For example, each of the bit lines 245 may be formed to include a polysilicon layer 242, a tungsten nitride layer 244 and a tungsten layer 246 which are sequentially stacked.

Multi-layered spacers 250 may be formed to surround sidewalls of the bit line structures 240. Each of the multi-layered spacers 250 may include an insulation liner 252, a first spacer 254 and a second spacer 256. In example embodiments, each of the multi-layered spacers 250 may include only one or two among the insulation liner 252, the first spacer 254 and the second spacer 256. In some other embodiments, each of the multi-layered spacers 250 may include an air spacer.

The buried contacts 280 may be disposed between the multi-layered spacers 250, and bottom surfaces of the buried contacts 280 may respectively contact the drain regions 216D of the active regions 216. The buried contacts 280 may be formed of a polysilicon layer, for example, a doped polysilicon layer. Each of the buried contacts 280 may include a barrier layer (not shown) such as a Ti/TiN layer. A metal silicide layer 285 may be formed on each of the buried contacts 280. The metal silicide layer 285 may be formed of, for example, a cobalt silicide ($CoSi_x$) layer, but the metal silicide layer 285 is not limited to a cobalt silicide ($CoSi_x$) layer.

If the DRAM device 200 is scaled down to increase its integration density, contact areas between the buried contacts 280 and the active regions 216 may be reduced. Thus, conductive landing pads 290a may be introduced into the DRAM device 200 to increase (and/or maximize) the contact areas between the buried contacts 280 and the active regions 216 as well as contact areas between the buried contacts 280 and lower electrodes (not shown) of capacitors. The landing pads 290a may be disposed between the buried contacts 280 and the active regions 216 or between the buried contacts 280 and the lower electrodes of capacitors. In a non-limiting example, the landing pads 290a may be disposed between the buried contacts 280 and the lower electrodes of the capacitors. More specifically, the landing pads 290a may be disposed on the metal silicide layers 285, respectively. Accordingly, if the landing pads 290a are introduced into the DRAM device 200, contact resistance values between the active regions 216 and the lower electrodes of the capacitors may be reduced.

Each of the landing pads 290a may include a barrier layer (not shown) and a metal layer on the barrier layer. In example embodiments, the barrier layer of each landing pad 290a may be formed of a Ti/TiN layer, as described above. Moreover, the metal layer of each landing pad 290a may be formed of a tungsten layer.

Elements indicated by a reference numeral "270" may correspond to fences that are disposed between the buried contacts 280 arrayed in the first direction (e.g., the y-axis direction), and the fences 270 may be formed of an insulation layer such as an oxide layer or a nitride layer. In addition, an element indicated by a reference numeral "278" may correspond to a capping insulation layer 278 that covers the landing pads 290a. Capacitors (not shown) may be formed to penetrate the capping insulation layer 278 and may be electrically connected to the landing pads 290a.

In the DRAM device 200, the direct contacts 235 may be disposed on central portions of the active regions 216, and the buried contacts 280 may be disposed on both ends of the active regions 216. Because the buried contacts 280 are disposed on both ends of the active regions 216, the landing pads 290a may be disposed to be adjacent to both ends of the active regions 216 and may be disposed to partially overlap with the buried contacts 280.

The word lines 224 may be formed to be buried in the substrate 210 and may be disposed to cross the active regions 216 between the direct contacts 235 and the buried contacts 280. As illustrated in FIG. 15A, each of the active regions 216 may be disposed to intersect two adjacent word lines 224, and the active regions 216 may be arrayed to be parallel with a diagonal direction in a plan view of FIG. 15A. Thus, the word lines 224 may intersect the active regions 216 at a non-right angle.

The direct contacts 235 may be disposed to be line symmetric with respect to the X-axis or the Y-axis. In addition, the buried contacts 280 may also be disposed to be line symmetric with respect to the X-axis or the Y-axis. Thus, the direct contacts 235 and the buried contacts 280 may be disposed on straight lines which are parallel with the first direction (e.g., the y-axis direction) or the second direction (e.g., the x-axis direction). Unlike the direct contacts 235 and the buried contacts 280, the landing pads 290a may be arrayed in a zigzag fashion along the first direction (e.g., the y-axis direction) in which the bit lines 245 extend.

Although FIGS. 15A, 15B, 15C and 15D illustrate the DRAM device 200, inventive concepts are not limited to the DRAM device. As described above, the heavily doped region 212 may be formed in a lower portion of the substrate 210, and the metal silicide layer 285 may be formed on each of the buried contacts 280. The buried contacts 280 may be formed of, for example, a polysilicon layer. In example embodiments, if the annealing process accompanied with electric field is applied to the DRAM device 200, impurity ions may be concentrated at interfaces between the buried contacts 280 and the metal silicide layer 285. As a result, contact resistance values between the buried contacts 280 and the metal silicide layer 285 may be reduced to improve characteristics of the DRAM device 200.

Figure 16A:
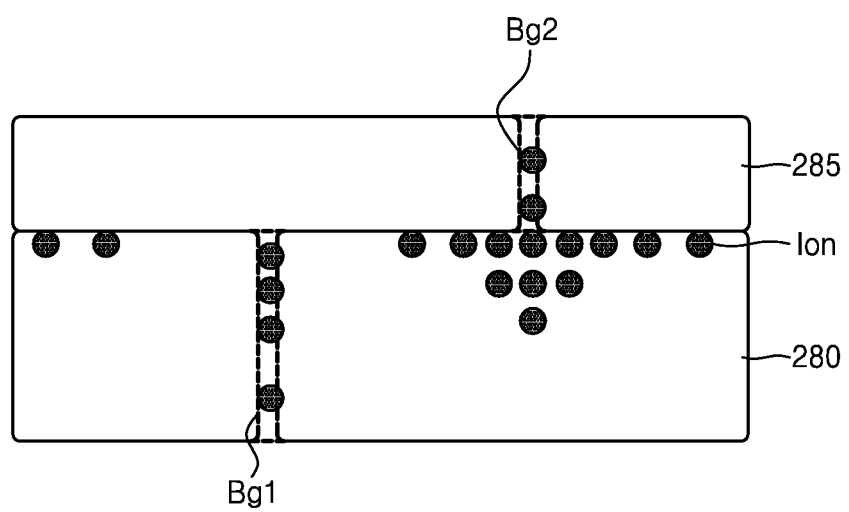
FIGS. 16A and 16B are schematic diagrams illustrating a DRAM device according to example embodiments.
Figure 16B:
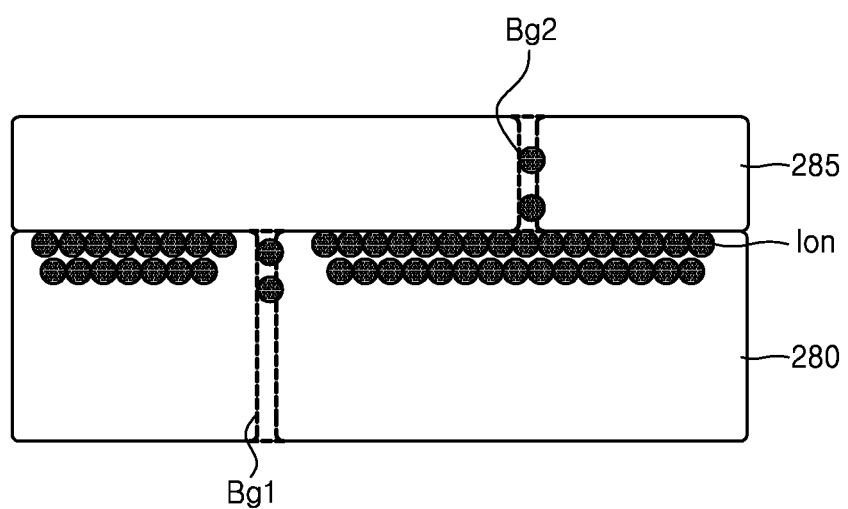

FIGS. 16A and 16B are schematic diagrams illustrating a DRAM device according to example embodiments.

Referring to FIGS. 16A and 16B, the semiconductor layer 280 may correspond to a buried contact and may be formed of a polysilicon layer. The metal silicide layer 285 may be disposed on the semiconductor layer 280 and may be formed of a cobalt silicide layer. As illustrated in FIGS. 16A and 16B, a first grain boundary Bg1 may exist in the semiconductor layer 280, and a second grain boundary Bg2 may exist in the metal silicide layer 285.

If only an annealing process is applied to the semiconductor layer 280 and the metal silicide layer 285 without any electric field, impurity ions Ion in the semiconductor layer 280 may leak through the second grain boundary Bg2 as illustrated in FIG. 16A. As a result, the impurity ions Ion may not be accumulated or concentrated at an interface between the semiconductor layer 280 and the metal silicide layer 285 to increase a contact resistance value between the semiconductor layer 280 and the metal silicide layer 285.

In contrast, if an annealing process accompanied with an electric field is applied to the semiconductor layer 280 and the metal silicide layer 285, most of the impurity ions Ion in the semiconductor layer 280 may be accumulated or concentrated at the interface between the semiconductor layer 280 and the metal silicide layer 285 as illustrated in FIG. 16B. Thus, the contact resistance value between the semiconductor layer 280 and the metal silicide layer 285 may be reduced.

Figure 17A:
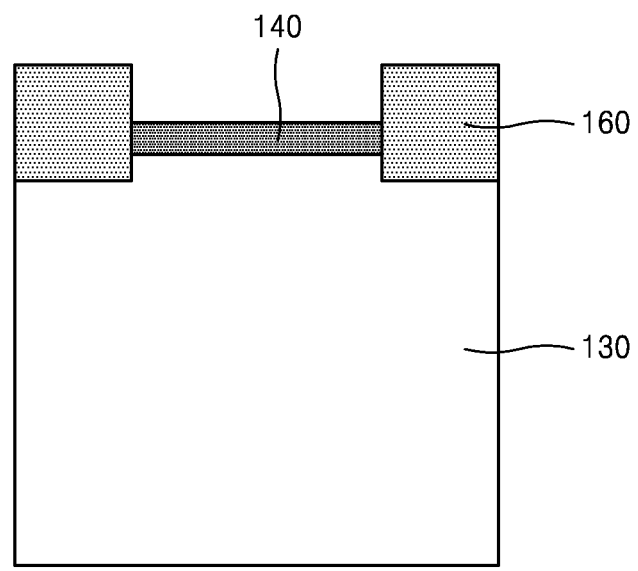
FIGS. 17A and 17B are cross-sectional views illustrating a principle of a silicide as dopant source (SADS) technology used in fabrication of semiconductor devices according to example embodiments.
Figure 17B:
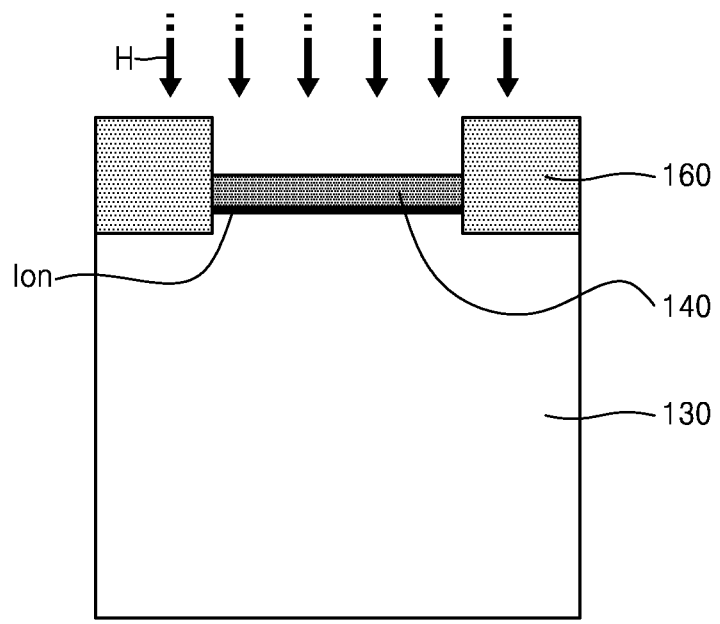

FIGS. 17A and 17B are cross-sectional views illustrating a principle of a silicide as dopant source (SADS) technology used in fabrication of semiconductor devices according to example embodiments.

Referring to FIGS. 17A and 17B, the SADS technology may mean a technology for forming a metal silicon layer 140 on an active layer 130 and for supplying dopants in the metal silicon layer 140 to the active layer 130 using an annealing process H. The SADS technology may be realized with an ion implantation process. If the SADS technology is applied to the metal silicon layer 140 and the active layer 130, impurity ions may be concentrated at an interface between the metal silicon layer 140 and the active layer 130 to make a thin junction. Thus, a contact resistance value between the metal silicon layer 140 and the active layer 130 may be reduced.

In example embodiments, the SADS technology may be realized together with the annealing process accompanied with electric field. That is, the annealing process accompanied with electric field may be performed by forming a metal silicide layer, applying an annealing process, applying an ion implantation process, and applying an electric field. As a result, impurity ions may be concentrated at an interface between the active layer 130 and the metal silicide layer 140, and the impurity ions may be stably activated. Thus, the concentration and the stable activation of the impurity ions may lead to decrease in a contact resistance value between the active layer 130 and the metal silicide layer 140, as described above.

Figure 18:
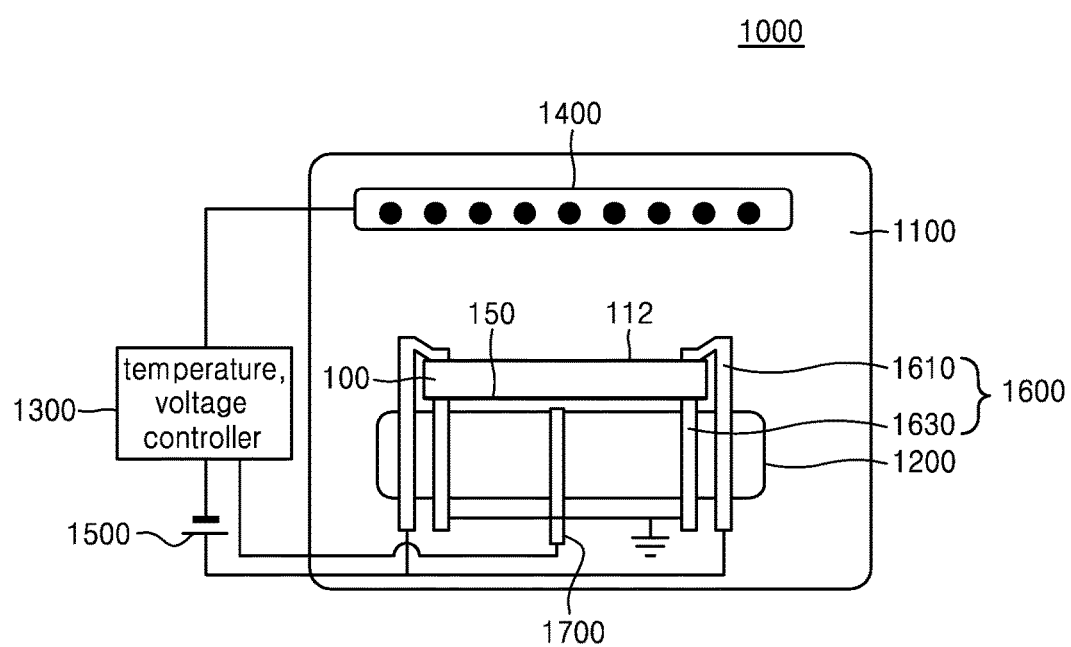
FIG. 18 a schematic view illustrating an apparatus used in fabrication of semiconductor devices according to example embodiments.
Figure 19:
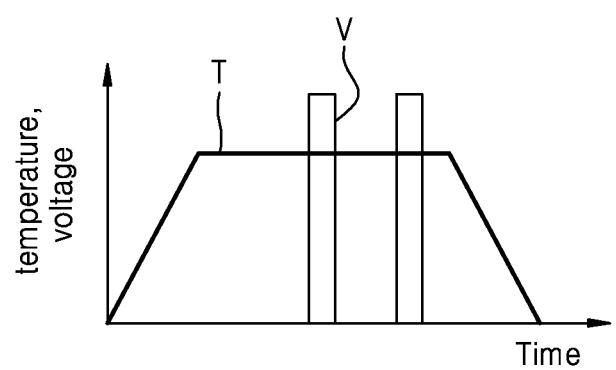
FIG. 19 is a graph illustrating a voltage and a temperature applied to a wafer loaded into the apparatus shown in FIG. 18.

FIG. 18 a schematic view illustrating an apparatus 1000 used in fabrication of semiconductor devices according to example embodiments, and FIG. 19 is a graph illustrating a voltage and a temperature applied to a wafer loaded into the apparatus shown in FIG. 18.

Referring to FIGS. 18 and 19, the apparatus 1000 may include an annealing chamber 1100, a supporter 1200, a temperature/voltage controller 1300, a heat source 1400, a power source 1500, a lead probe unit 1600, and a temperature sensor 1700.

The annealing chamber 1100 may basically have the same or similar configuration as general annealing chambers. However, the annealing chamber 1100 may further include some elements to create electric field which is applied to semiconductor devices loaded therein. The annealing chamber 1100 may isolate an inside space thereof from an external environment. The annealing chamber 1100 may include a chamber wall separating the inside space thereof from the external environment and internal elements disposed in the chamber wall.

A wafer 100 may be loaded into the annealing chamber 1100, and the wafer 100 may be put on the supporter 1200 which is installed in the annealing chamber 1100. That is, the wafer 100 may be supported by the supporter 1200 in the annealing chamber 1100. Accordingly, a planar area of the supporter 1200 may be greater than a planar area of the wafer 100. However, in example embodiments, a planar area of the supporter 1200 may be equal to or less than a planar area of the wafer 100. The supporter 1200 may be formed of or coated by a metal material having low heat conductivity and an excellent heat resistant property. For example, the supporter 1200 may be formed of or coated by a nickel chrome (NiCr) material.

The temperature/voltage controller 1300 may control a temperature and a voltage which are applied to the wafer 100. For example, the temperature/voltage controller 1300 may control a temperature applied to the wafer 100 so that a temperature profile T of the wafer 100 has a trapezoidal shape as the time elapses. Moreover, the temperature/voltage controller 1300 may also control a voltage applied to the wafer 100 so that a voltage signal V having a pulse waveform is applied to the wafer 100 while the wafer 100 is heated to exhibit the temperature profile T. However, the temperature and the voltage applied to the wafer 100 are not limited to the temperature profile T and the voltage signal V illustrated in FIG. 19. For example, in example embodiments, a voltage signal having a square waveform may be applied to the wafer 100 during a desired (and/or alternatively predetermined) period while the wafer 100 is heated. That is, a constant voltage may be applied to the wafer 100 during the desired (and/or alternatively predetermined) period while the wafer 100 is heated to have a constant temperature.

The heat source 1400 may be disposed over the wafer 100 put on the supporter 1200. The heat source 1400 may include a plurality of lamps. The heat source 1400 may emit heat toward the wafer 100, and the temperature/voltage controller 1300 may control operations of the heat source 1400 to adjust the temperature of the wafer 100. The temperature sensor 1700 may be disposed under the wafer 100 to control the temperature of the wafer 100. More specifically, the temperature sensor 1700 may detect and measure the temperature of the wafer 100, and information on the measured temperature of the wafer 100 may be transmitted to the temperature/voltage controller 1300. The temperature/voltage controller 1300 may receive the temperature information from the temperature sensor 1700 and may control on/off operations of the lamps constituting the heat source 1400 to control the temperature of the wafer 100. The temperature sensor 1700 may be electrically connected to the temperature/voltage controller 1300 to transmit the temperature information on the wafer 100 to the temperature/voltage controller 1300.

Although FIG. 18 illustrates an example in which the temperature sensor 1700 penetrates the supporter 1200, inventive concepts are not limited thereto. For example, in example embodiments, the temperature sensor 1700 may be disposed on a top surface of the supporter 1200 and input/output signal lines of the temperature sensor 1700 may extend along a sidewall of the supporter 1200 to reach the temperature/voltage controller 1300.

The power source 1500 may apply a voltage to the wafer 100 through the lead probe unit 1600. The power source 1500 may be electrically connected to the temperature/voltage controller 1300, and operations of the power source 1500 may be controlled by the temperature/voltage controller 1300.

The lead probe unit 1600 may include upper lead probes 1610 and lower lead probes 1630. The upper lead probes 1610 may be electrically connected to a positive terminal of the power source 1500, and the lower lead probes 1630 may be electrically connected to a negative terminal (e.g., a ground terminal) of the power source 1500. Although FIG. 18 illustrates an example in which the upper and lower lead probes 1610 and 1630 penetrate the supporter 1200, inventive concepts are not limited thereto. For example, in example embodiments, the upper and lower lead probes 1610 and 1630 may be disposed on sidewalls of the supporter 1200.

The upper lead probes 1610 may extend to contact a lower electrode 112 which is formed on a top surface of the wafer 100, and the lower lead probes 1630 may extend to contact an upper electrode 150 which is formed on a bottom surface of the wafer 100.

The upper and lower lead probes 1610 and 1630 may be formed of a metal material having a low heat conductivity and an excellent heat resistant property. For example, the upper and lower lead probes 1610 and 1630 may be formed of a nickel chrome (NiCr) material. In addition, each of the upper and lower lead probes 1610 and 1630 may have a shape that is suitable for contacting the lower electrode 112 or the upper electrode 150. Upper ends of the upper lead probes 1610 may be disposed between the wafer 100 and the heat source 1400 to apply the voltage to the wafer 100. In such a case, upper ends of the upper lead probes 1610 have to be designed to reduce (and/or minimize) a shadow effect that the upper ends of the upper lead probes 1610 block the heat emitted from the heat source 1400. In example embodiments, each of the upper ends of the upper lead probes 1610 may be designed to have a pin shape.

While some example embodiments of inventive concepts has been particularly shown and described, it will be understood that various changes in form and details may be made therein without departing from the spirit and scope of the following claims.

What is claimed is:

1. A semiconductor device comprising:
    a substrate;
    upper impurity regions in upper portions of the substrate;
    metal electrodes electrically connected to the upper impurity regions;
    metal silicide layers between the metal electrodes and the upper, impurity regions;
    a lower impurity region in a lower portion of the substrate; and
    global buried contacts (GBCs) respectively on the upper impurity regions,
    wherein,
        the semiconductor device includes a dynamic random access memory (DRAM) device, and
        the metal silicide layers are between the GBCs and the metal electrodes, and
    impurity ions are concentrated at an interface between the GBCs and the metal silicide layers.

2. The semiconductor device of claim 1, wherein
    the GBCs comprise polysilicon (Poly-Si), and
    the metal silicide layers comprises cobalt silicide ($CoSi_2$).

3. The semiconductor device of claim 1, wherein
    the impurity ions are accumulated at the interface between the GBCs and the metal silicide layers.

4. A semiconductor device comprising:
a substrate in which a plurality of active regions are defined;
an upper impurity region in an upper portion of each of the plurality of active regions;
gate lines embedded in the substrate across the plurality of active regions;
a metal electrode electrically connected to the upper impurity region; and
a metal silicide layer between the upper impurity region and the metal electrode, wherein,
- the semiconductor device includes a dynamic random access memory (DRAM) device,
- a first contact electrically connected to a bit line and a second contact electrically connected to a capacitor are arranged on the upper impurity region,
- the metal silicide layer is between the second contact and the metal electrode and
- impurity ions are concentrated at an interface between the second contact and the metal silicide layer.

5. The semiconductor device of claim 4, wherein
the second contact comprises impurity ions, and
the impurity ions are moved to be concentrated at an interface between the second contact and the metal silicide layer.

6. The semiconductor device of claim 4, wherein
the second contact comprises polysilicon,
the metal silicide layer comprises cobalt silicide, and
the metal electrode is in contact with a lower electrode of the capacitor.

7. The semiconductor device of claim 4, further comprising a lower impurity region in a lower portion of the substrate.

8. The semiconductor device of claim 4, wherein
the impurity ions are accumulated at the interface between the second contact and the metal silicide layer.

* * * * *